United States Patent
Hong et al.

(12)

(10) Patent No.: US 12,056,305 B2
(45) Date of Patent: Aug. 6, 2024

(54) PRESSURE SENSOR, PRESSURE SENSOR PIXEL ARRAY INCLUDING PRESSURE SENSOR, AND ELECTRONIC SYSTEM INCLUDING PRESSURE SENSOR

(71) Applicant: SAMSUNG ELECTRONICS CO., LTD., Suwon-si (KR)

(72) Inventors: Yongtaek Hong, Seoul (KR); Daesik Kim, Seoul (KR); Eunho Oh, Seoul (KR); Byeongmoon Lee, Seoul (KR)

(73) Assignees: SAMSUNG ELECTRONICS CO., LTD., Suwon-Si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 18/076,675

(22) Filed: Dec. 7, 2022

(65) Prior Publication Data
US 2023/0214044 A1   Jul. 6, 2023

(30) Foreign Application Priority Data

Jan. 5, 2022 (KR) .................. 10-2022-0001640
Mar. 8, 2022 (KR) .................. 10-2022-0029469

(51) Int. Cl.
*G06F 3/041* (2006.01)
*G06F 3/045* (2006.01)
*H10N 30/30* (2023.01)

(52) U.S. Cl.
CPC ........ *G06F 3/04146* (2019.05); *G06F 3/0412* (2013.01); *G06F 3/045* (2013.01); *H10N 30/302* (2023.02)

(58) Field of Classification Search
CPC .... G06F 3/04146; G06F 3/0412; G06F 3/045; G06F 3/04144; H10N 30/302;
(Continued)

(56) References Cited

U.S. PATENT DOCUMENTS

2007/0078215 A1  1/2007  Rossetti
2013/0082970 A1*  4/2013  Frey .................. H01H 65/00
                                                           345/173
(Continued)

FOREIGN PATENT DOCUMENTS

JP   2007-231127   9/2007
JP   2011-213501   10/2011
(Continued)

OTHER PUBLICATIONS

Daesik Kim, Dong Keon Lee, Jinsu Yoon, Donghyo Hahm, Byeongmoon Lee, Eunho Oh, Geonhee Kim, Jiseok Seo, Hanul Kim and Yongtaek Hong,Electronic Skin Based on a Cellulose/ Carbon Nanotube Fiber Network for Large-Area 3D Touch and Real-Time 3D Surface Scanning, 2021,ACS Applied Materials & Interfaces 13(44) (Year: 2021).*

(Continued)

*Primary Examiner* — Michael J Jansen, II
*Assistant Examiner* — Ivelisse Martinez Quiles
(74) *Attorney, Agent, or Firm* — F. CHAU & ASSOCIATES, LLC

(57) ABSTRACT

A pressure sensor includes: a first substrate; a second substrate having an inner surface and a touch surface that is opposite to the inner surface, wherein the inner surface faces the first substrate with a resistance sensing space therebetween; a first electrode and a second electrode, which are arranged spaced apart from each other in the resistance sensing space; and a piezoresistive pattern arranged between the first electrode and the second electrode and disposed in the resistance sensing space, wherein the piezoresistive pattern includes a porous elastic support and a plurality of conductive carbon structures dispersed in the porous elastic support.

17 Claims, 26 Drawing Sheets

(58) Field of Classification Search
CPC ........ H10N 30/85; H10N 30/87; H10N 30/00; H10N 30/03; H10N 30/05–057; H10N 30/306; G01L 1/18; Y10T 29/42
See application file for complete search history.

(56) References Cited

U.S. PATENT DOCUMENTS

| | | | |
|---|---|---|---|
| 2014/0300251 A1* | 10/2014 | Colli | G06F 3/03547 29/25.35 |
| 2015/0248159 A1* | 9/2015 | Luo | G01L 1/186 427/117 |
| 2017/0220162 A1* | 8/2017 | Ko | G06F 3/045 |
| 2017/0261388 A1* | 9/2017 | Ma | G01L 1/2287 |
| 2017/0350772 A1* | 12/2017 | DeGanello | G01L 1/20 |
| 2017/0350773 A1* | 12/2017 | Ma | G01L 1/18 |
| 2018/0018055 A1* | 1/2018 | Li | G01B 7/18 |
| 2019/0219460 A1* | 7/2019 | Cho | G01L 1/18 |
| 2019/0391692 A1* | 12/2019 | Park | G06F 1/1643 |
| 2023/0228633 A1* | 7/2023 | Lee | H10N 30/067 73/862 |

FOREIGN PATENT DOCUMENTS

| | | |
|---|---|---|
| JP | 2013-199419 | 10/2013 |
| KR | 10-2007-0038251 | 4/2007 |
| KR | 10-0801497 | 1/2008 |
| KR | 10-1210937 | 12/2012 |
| KR | 10-1391770 | 4/2014 |
| KR | 10-1413718 | 6/2014 |
| KR | 10-1527863 | 6/2015 |

OTHER PUBLICATIONS

Daesik Kim et al., "Electronic Skin Based on a Cellulose/Carbon Nanotube Fiber Network for Large Area 3D Touch and Real-Time 3D Surface Scanning", ACS Appl. Mater. Interfaces 2021, 13, pp. 53111-53119.

Hao Zhang, et al., "Flexible and Pressure-Responsive Sensors from Cellulose Fibers Coated with Multiwalled Carbon Nanotubes", ACS Applied Electronic Materials 2019 1 (7), pp. 1179-1188.

Zefeng Chen, "Flexible Piezoelectric-Induced Pressure Sensors for Static Measurements Based on Nanowires/Graphene Heterostructures", ACS Nano, 11, 5 (2017), pp. 4507-4513.

Z. Zhan, et al. "Paper-Carbon Nanotube Based Wearable Pressure Sensor for Physiological Signal Acquisition and Soft Robotic Skin", ACS Appl. Mater. Interfaces 2017, 9, pp. 37921-37928.

L. Q. Tao, et al., "Graphene-Paper Pressure Sensor for Detecting Human Motions", ACS Nano 2017, 11, pp. 8790-8795.

Lei Gao et al., "All Paper-Based Flexible and Wearable Piezoresistive Pressure Sensor", ACS Appl. Mater. Interfaces 2019, 11, pp. 25034-25042.

S. Gong, et al., "A Wearable and Highly Sensitive Pressure Sensor with Ultrathin Gold Nanowires", Nat. Commun. 2014, 5, No. 3132, pp. 1-8.

S. Chen, et al., "Flexible and Highly Sensitive Resistive Pressure Sensor Based on Carbonized Crepe Paper with Corrugated Structure", ACS Appl. Mater. Interfaces 2018, 10, pp. 34646-34654.

Pratik M. Pataniya, et al., "Flexible paper based piezo-resistive sensor functionalised by 2D-WSe2 nanosheets", Nanotechnology 31 (2020) 435503 (23 pages).

Miao Wang, et al., "Modifying Native Nanocellulose Aerogels with Carbon Nanotubes for Mechanoresponsive Conductivity and Pressure Sensing", Adv. Mater. 2013, 25, pp. 2428-2432.

Shuaidi Zhang, et al., "Ultrasensitive and Highly Compressible Piezoresistive Sensor Based on Polyurethane Sponge Coated with a Cracked Cellulose Nanofibril/Silver Nanowire Layer", ACS Appl. Mater. Interfaces 2019, 11, pp. 10922-10932.

Ying Huang, et al. "Highly sensitive pressure sensor based on structurally modified tissue paper for human physiological activity monitoring", J. Appl. Polym. Sci.2020, 48973 (10 pages).

Mengmeng Liu, et al., "Large-Area All-Textile Pressure Sensors for Monitoring Human Motion and Physiological Signals", Adv. Mater. 2017, 29, 1703700 (9 pages).

Yanjun Zhenga, et al., "Conductive MXene/cotton fabric based pressure sensor with both high sensitivity and wide sensing range for human motion detection and E-skin", Chemical Engineering Journal, 420 (2021) 127720 (32 pages).

* cited by examiner

PRESSURE SENSOR, PRESSURE SENSOR PIXEL ARRAY INCLUDING PRESSURE SENSOR, AND ELECTRONIC SYSTEM INCLUDING PRESSURE SENSOR

CROSS-REFERENCE TO RELATED APPLICATIONS

This application claims priority under 35 U.S.C. § 119 to Korean Patent Application No. 10-2022-0001640, filed on Jan. 5, 2022, and Korean Patent Application No. 10-2022-0029469, filed on Mar. 8, 2022, in the Korean Intellectual Property Office, the disclosures of which are incorporated by reference herein in their entireties.

TECHNICAL FIELD

The present inventive concept relates to a pressure sensor, a pressure sensor pixel array including the pressure sensor, and an electronic system including the pressure sensor, and more particularly, to a pressure sensor configured to measure the magnitude of force generated by a touch, and a pressure sensor pixel array and an electronic system both including the pressure sensor.

DISCUSSION OF THE RELATED ART

Recently, as pressure sensors may be applied to robots, electronic skins, and the like and there is an increasing demand for tactile sensors to measure a fine magnitude of pressure, it has become desirable to develop a pressure sensor that functions in various environments and has a relatively high sensitivity to a wide range of pressure magnitudes.

SUMMARY

According to an embodiment of the present inventive concept, a pressure sensor includes: a first substrate; a second substrate having an inner surface and a touch surface that is opposite to the inner surface, wherein the inner surface faces the first substrate with a resistance sensing space therebetween; a first electrode and a second electrode, which are arranged spaced apart from each other in the resistance sensing space; and a piezoresistive pattern arranged between the first electrode and the second electrode and disposed in the resistance sensing space, wherein the piezoresistive pattern includes a porous elastic support and a plurality of conductive carbon structures dispersed in the porous elastic support.

According to an embodiment of the present inventive concept, a pressure sensor pixel array includes: a first substrate; a second substrate having an inner surface and a touch surface that is opposite to the inner surface, wherein the inner surface faces the first substrate with a resistance sensing space therebetween; a plurality of pixel areas arranged spaced apart from each other in a horizontal direction in the resistance sensing space; and a plurality of pressure sensors respectively arranged in the plurality of pixel areas, wherein each of the plurality of pressure sensors includes: a first electrode and a second electrode, which are arranged spaced apart from each other in each of the plurality of pixel areas; and a piezoresistive pattern arranged between the first electrode and the second electrode in each of the plurality of pixel areas, and wherein the piezoresistive pattern includes a porous elastic support and a plurality of conductive carbon structures dispersed in the porous elastic support.

According to an embodiment of the present inventive concept, a pressure sensor pixel array includes: a first substrate; a plurality of pixel areas arranged spaced apart from each other on the first substrate, wherein the plurality of pixel areas are arranged in a matrix form in a first horizontal direction and a second horizontal direction, which intersect each other; a plurality of first electrode lines including a plurality of first local electrodes and extending lengthwise in the second horizontal direction on the first substrate, wherein the plurality of first local electrodes respectively cover the plurality of pixel areas; a plurality of second electrode lines including a plurality of second local electrodes and arranged respectively apart from the plurality of first electrode lines in the plurality of pixel areas, wherein the plurality of second electrode lines extend lengthwise in the first horizontal direction on the first substrate, wherein the plurality of second local electrodes are arranged spaced apart from the plurality of first local electrodes and cover the plurality of pixel areas, respectively; a plurality of piezoresistive patterns disposed on the plurality of first local electrodes and the plurality of second local electrodes in the plurality of pixel areas, respectively; and a second substrate arranged spaced apart from the plurality of first local electrodes and the plurality of second local electrodes with the plurality of piezoresistive patterns therebetween, wherein the second substrate faces the first substrate with the plurality of first electrode lines, the plurality of second electrode lines, and the plurality of piezoresistive patterns therebetween, wherein the plurality of piezoresistive patterns are arranged spaced apart from each other to respectively correspond to the plurality of pixel areas, and wherein each of the plurality of piezoresistive patterns includes a porous elastic support and a plurality of conductive carbon structures dispersed in the porous elastic support, wherein each of the plurality of piezoresistive patterns have a network structure including a plurality of pores.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Figure 1A:
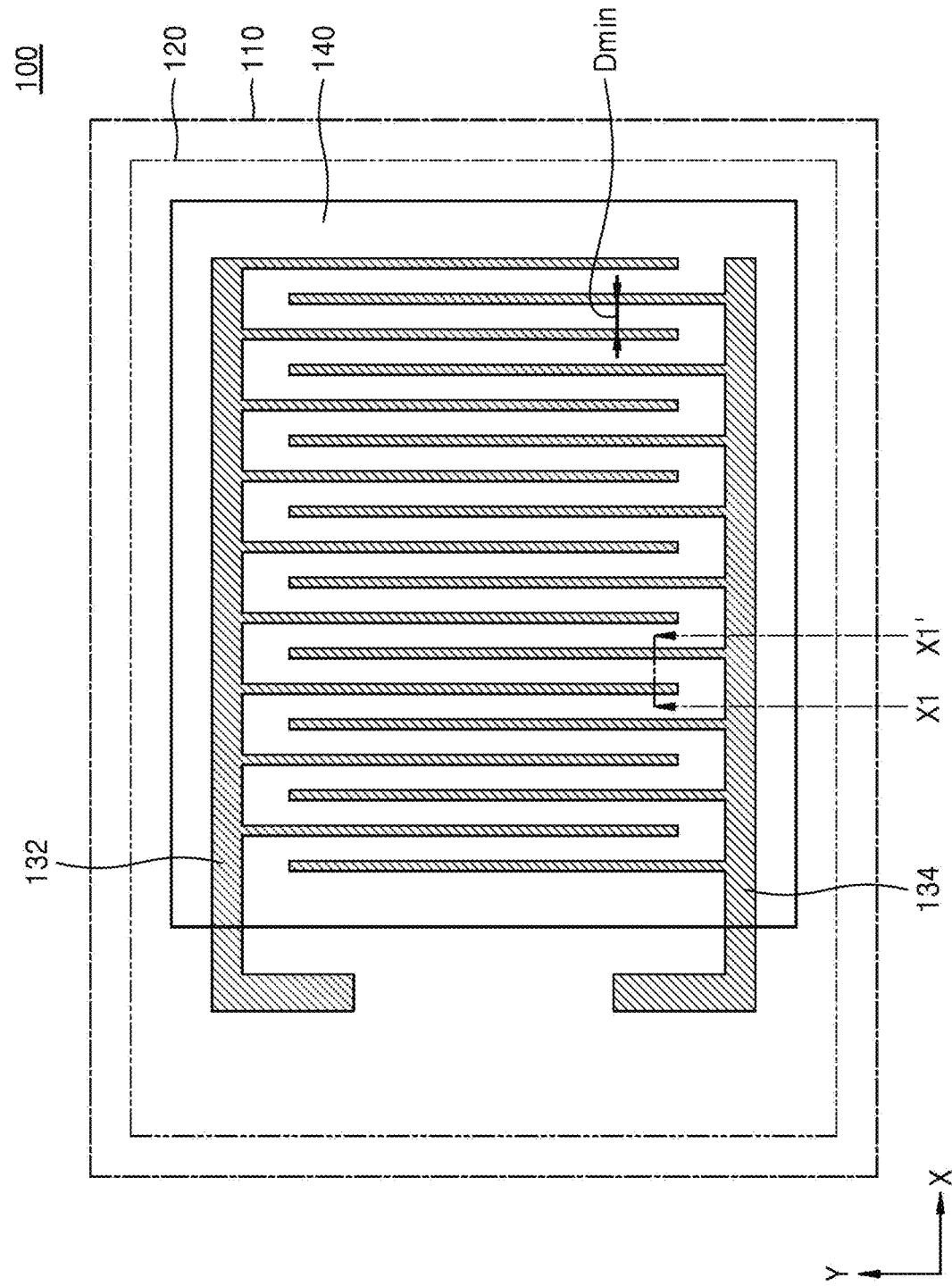
FIG. 1A is a planar layout diagram of a pressure sensor according to an embodiment of the present inventive concept.

Hereinafter, embodiments of the present inventive concept will be described in detail with reference to the accompanying drawings. Like components may be denoted by like reference numerals throughout the specification, and repeated descriptions thereof may be omitted.

Figure 1B:
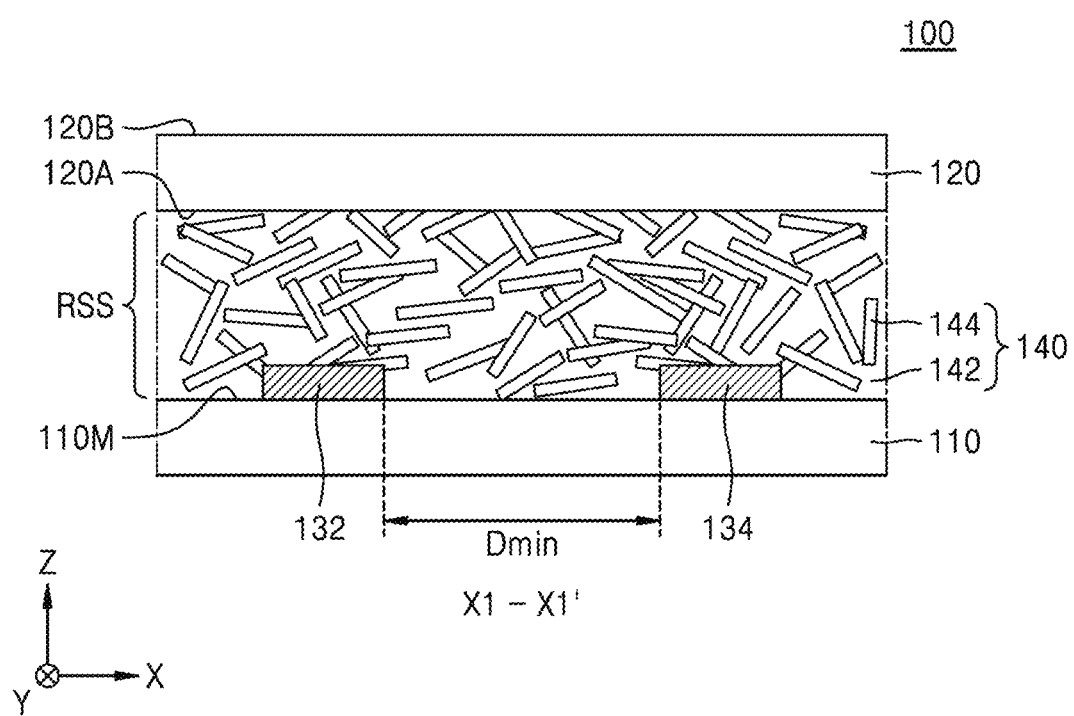
FIG. 1B is an enlarged cross-sectional view taken along a line X1-X1' of FIG. 1A.

FIG. 1A is a planar layout diagram of a pressure sensor 100 according to an embodiment of the present inventive concept, FIG. 1B is an enlarged cross-sectional view taken along a line X1-X1' of FIG. 1A.

Referring to FIGS. 1A and 1B, the pressure sensor 100 may include a first substrate 110 and a second substrate 120, which face each other with a resistance sensing space RSS therebetween. The first substrate 110 and the second substrate 120 may be arranged parallel to each other along a plane (for example, an X-Y plane).

The first substrate 110 may have a main surface 110M facing the resistance sensing space RSS. The second substrate 120 may have an inner surface 120A and a touch surface 120B that is opposite to the inner surface 120A, the inner surface 120A facing the first substrate 110 with the resistance sensing space RSS therebetween. For example, the inner space 120 may face the resistance sensing space RSS.

Each of the first substrate 110 and the second substrate 120 may include an insulating substrate. Each of the first substrate 110 and the second substrate 120 may include a rigid substrate or a flexible substrate. For example, the rigid substrate may include a glass substrate, a quartz substrate, a silicon substrate, or a combination thereof. For example, the flexible substrate may include, but is not limited to, a polymer substrate, a plastic substrate, or a combination thereof. For example, the flexible substrate may include, but is not limited to, polyimide (PT), polyethylene naphthalate (PEN), polyethylene terephthalate (PET), polypropylene (PP), polycarbonate (PC), polyethersulfone (PES), polyacrylate, polyetherimide (PEI), polyphenylene sulfide (PPS), polyarylate (PAR), triacetate cellulose (TAC), cellulose acetate propionate (CAP), fiber glass reinforced plastic, or a combination thereof. When each of the first substrate 110 and the second substrate 120 includes a flexible substrate, a flexible electronic system, for example, a flexible tactile sensor, a flexible display device, or the like, may be implement with the pressure sensor 100.

A first electrode 132 and a second electrode 134 may be arranged spaced apart from each other in the resistance sensing space RSS. FIG. 1A illustrates an example in which each of the first electrode 132 and the second electrode 134 has a comb shape including a plurality of finger portions to constitute interdigitated electrodes. For example, each of the first electrode 132 and the second electrode 134 may have a plurality of protrusions. For example, the plurality of protrusions of the first electrode 132 may extend toward the second electrode 134, and the plurality of protrusions of the second electrode 134 may extend toward the first electrode 132. As another example, the protrusions of the first electrode 132 may be alternately arranged with the protrusions of the second electrode 134 in the first direction X. However, the present inventive concept is not limited thereto. The shape of each of the first electrode 132 and the second electrode 134 may be variously modified and changed, as needed.

As shown in FIG. 1B, each of the first electrode 132 and the second electrode 134 may face the second substrate 120 with a piezoresistive pattern 140 therebetween. In a vertical direction (Z direction) with respect to the main surface 110M of the first substrate 110, the height of each of the first electrode 132 and the second electrode 134 may be less than the minimum distance between the first substrate 110 and the second substrate 120.

Each of the first electrode 132 and the second electrode 134 may include a metal, a conductive metal nitride, an alloy, a doped semiconductor, a conductive polymer, a conductive compound, or a combination thereof. For example, each of the first electrode 132 and the second electrode 134 may include silver (Ag), gold (Au), platinum (Pt), tungsten (W), chromium (Cr), molybdenum (Mo), iron (Fe), cobalt (Co) copper (Cu), palladium (Pd), titanium (Ti), aluminum (Al), indium tin oxide (ITO), indium zinc oxide (IZO), poly(3,4-ethylenedioxythiophene):poly(4-styrenesulfonate) (PEDOT:PSS), polyacetylene, polyparaphenylene, polypyrole, polyaniline, or a combination thereof.

In an embodiment of the present inventive concept, each of the first electrode 132 and the second electrode 134 may include a transparent electrode or a translucent electrode.

The piezoresistive pattern 140 may be arranged on the first electrode 132 and the second electrode 134 in the resistance sensing space RSS. The piezoresistive pattern 140 may fill a space between the first electrode 132 and the second electrode 134 in the resistance sensing space RSS. In the resistance sensing space RSS, the piezoresistive pattern 140 may contact the inner surface 120A of the second substrate 120.

The piezoresistive pattern 140 may include a porous elastic support 142 and a plurality of conductive carbon structures 144 dispersed in the porous elastic support 142. For example, in the piezoresistive pattern 140, the plurality of conductive carbon structures 144 may be irregularly dispersed in the porous elastic support 142.

In an embodiment of the present inventive concept, the porous elastic support 142 may include cellulose. The plurality of conductive carbon structures 144 may each include a porous carbon-based material. The porous carbon-based material may include a carbon nanotube, a carbon nanohorn, carbon fiber, natural graphite, artificial graphite, carbon black, graphene, activated carbon, or a combination thereof. In an embodiment of the present inventive concept, the carbon nanotube may include a single-walled carbon nanotube, a double-walled carbon nanotube, a multi-walled carbon nanotube, or a combination thereof. In an embodiment of the present inventive concept, the carbon nanotube may include a single-walled carbon nanotube that is surface-functionalized with a hydroxyl group. When the plurality of conductive carbon structures 144 each include a single-walled carbon nanotube, a flexible electronic system may be implemented by using the pressure sensor 100.

The piezoresistive pattern 140 may have a network structure including a plurality of pores, and the network structure may be formed by intertwining the porous elastic support 142 with the plurality of conductive carbon structures 144. As such, because the piezoresistive pattern 140 has a network structure including a plurality of pores, the Young's modulus of the piezoresistive pattern 140 may be relatively low. In an embodiment of the present inventive concept, the Young's modulus of the piezoresistive pattern 140 may be, but is not limited to, about 1.4 GPa to about 7 GPa. Because the piezoresistive pattern 140 has a relatively low Young's modulus, the piezoresistive pattern 140 may provide relatively high flexibility and may be physically deformed with relative ease without deteriorating the durability of the piezoresistive pattern 140, in response to a physical stimulus from outside thereof.

In an embodiment of the present inventive concept, each of the plurality of conductive carbon structures 144 in the piezoresistive pattern 140 may include a single-walled carbon nanotube having a length ranging from about 5 μm to about 30 μm and a diameter ranging from about 1 nm to about 3 nm. The porous elastic support 142 in the piezoresistive pattern 140 may include a plurality of pieces of cellulose, each having a length ranging from about 20 μm to about 50 μm.

Figure 1C:
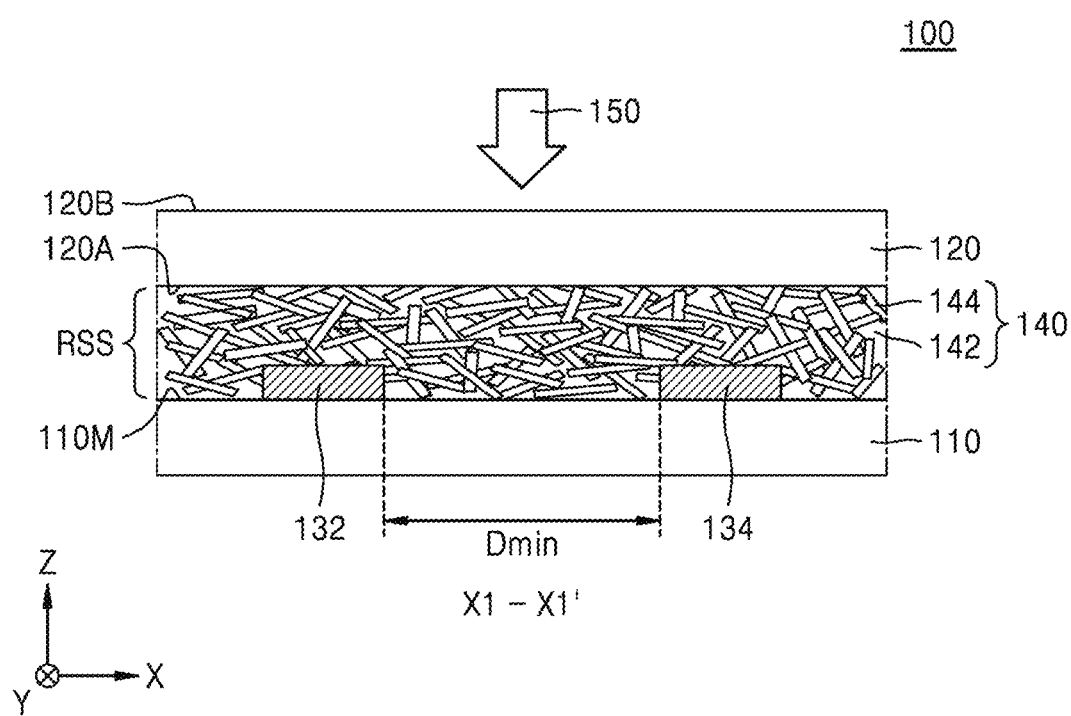
FIG. 1C is a cross-sectional view illustrating a structure of a pressure sensor according to an embodiment of the present inventive concept when a physical stimulus is applied to the pressure sensor from outside the pressure sensor.

FIG. 1C is a cross-sectional view of a structure of the pressure sensor 100 of FIG. 1B when a physical stimulus is applied to the touch surface 120B of the second substrate 120 from outside the pressure sensor 100.

Referring to FIG. 1C, the porous elastic support 142 in the piezoresistive pattern 140 may have a relatively high elastic modulus. Accordingly, as shown in FIG. 1C, when a physical stimulus 150 is applied to the touch surface 120B of the second substrate 120 from outside the pressure sensor 100, the porous elastic support 142 may be easily deformed by the physical stimulus 150.

In the piezoresistive pattern 140, the plurality of conductive carbon structures 144 may provide a conductive path between the first electrode 132 and the second electrode 134, in response to the physical stimulus 150 that is applied to the touch surface 120B of the second substrate 120. In the piezoresistive pattern 140, when the porous elastic support 142 is compressed by a force of the applied external physical stimulus 150, adjacent conductive carbon structures 144 from among the plurality of conductive carbon structures 144 may be brought into contact with each other, and thus, a conductive path may be formed between the first electrode 132 and the second electrode 134. In addition, when the application of the physical stimulus 150 is released from the touch surface 120B of the second substrate 120, the porous elastic support 142 that is contracted or compressed may be restored to a state before the physical stimulus 150 is applied, and the plurality of conductive carbon structures 144 may also be restored to positions before the physical stimulus 150 is applied. For example, once the physical stimulus 150 is removed, the adjacent conductive carbon structures 144 might not be in contact with each other and the conductive path may be dissembled. Accordingly, a resistance change in the pressure sensor 100 may be induced by the presence or not or a magnitude change of the physical stimulus 150 applied to the touch surface 120B of the second substrate 120 from outside the pressure sensor 100.

The first electrode 132 and the second electrode 134 may be arranged at the same level as each other on the first substrate 110. As shown in FIGS. 1B and 1C, the first electrode 132 and the second electrode 134 may be arranged at a level at which respective minimum distances thereof from the second substrate 120 in the vertical direction (e.g., the Z direction) with respect to the main surface 110M of the first substrate 110 are equal to each other. For example, the minimum distance between the first electrode 132 and the second substrate 120 in the vertical direction is equal to the minimum distance between the second electrode 134 and the second substrate 120 in the vertical direction. Each of the first electrode 132 and the second electrode 134 may be arranged closer to the first substrate 110 than to the second substrate 120. In an embodiment of the present inventive concept, each of the first electrode 132 and the second electrode 134 may contact, the main surface 110M of the first substrate 110. In an embodiment of the present inventive concept, a certain portion of one surface of the piezoresistive pattern 140 may contact the main surface 110 M of the first substrate 110, and the other surface of the piezoresistive pattern 140 may contact the inner surface 120A of the second substrate 120.

In the piezoresistive pattern 140, a weight proportion of the plurality of conductive carbon structures 144 may be equal to or less than a weight proportion of the porous elastic support 142. In an embodiment of the present inventive concept, the plurality of conductive carbon structures 144 may be present in an amount of about 5% by weight (wt %) to about 50 wt % in a unit volume of the piezoresistive pattern 140. In an embodiment of the present inventive concept, the plurality of conductive carbon structures 144 may be present in an amount of about 10 wt % to about 20 wt %, for example, about 15 wt % to about 20 wt %, in the unit volume of the piezoresistive pattern 140.

In an embodiment of the present inventive concept, as shown in FIGS. 1A and 1B, a minimum distance Dmin between the first electrode 132 and the second electrode 134 may be, but is not limited to, about 100 µm to about 500 µm. In the pressure sensor 100, by adjusting the minimum distance Dmin between the first electrode 132 and the second electrode 134 and the width of each of the first electrode 132 and the second electrode 134, the transparency of the pressure sensor 100 may be adjusted. For example, the transparency of the pressure sensor 100 may increase with the increasing minimum distance Dmin between the first electrode 132 and the second electrode 134. In an embodiment of the present inventive concept, by appropriately selecting the minimum distance Dmin between the first electrode 132 and the second electrode 134 from a range of about 100 µm to about 500 µm, the pressure sensor 100 may have a transmittance of at least 70%, approximately, of visible light. For example, the minimum distance Dmin between the first electrode 132 and the second electrode 134 may be, but is not limited to, at least 200 µm, approximately.

Figure 1D:
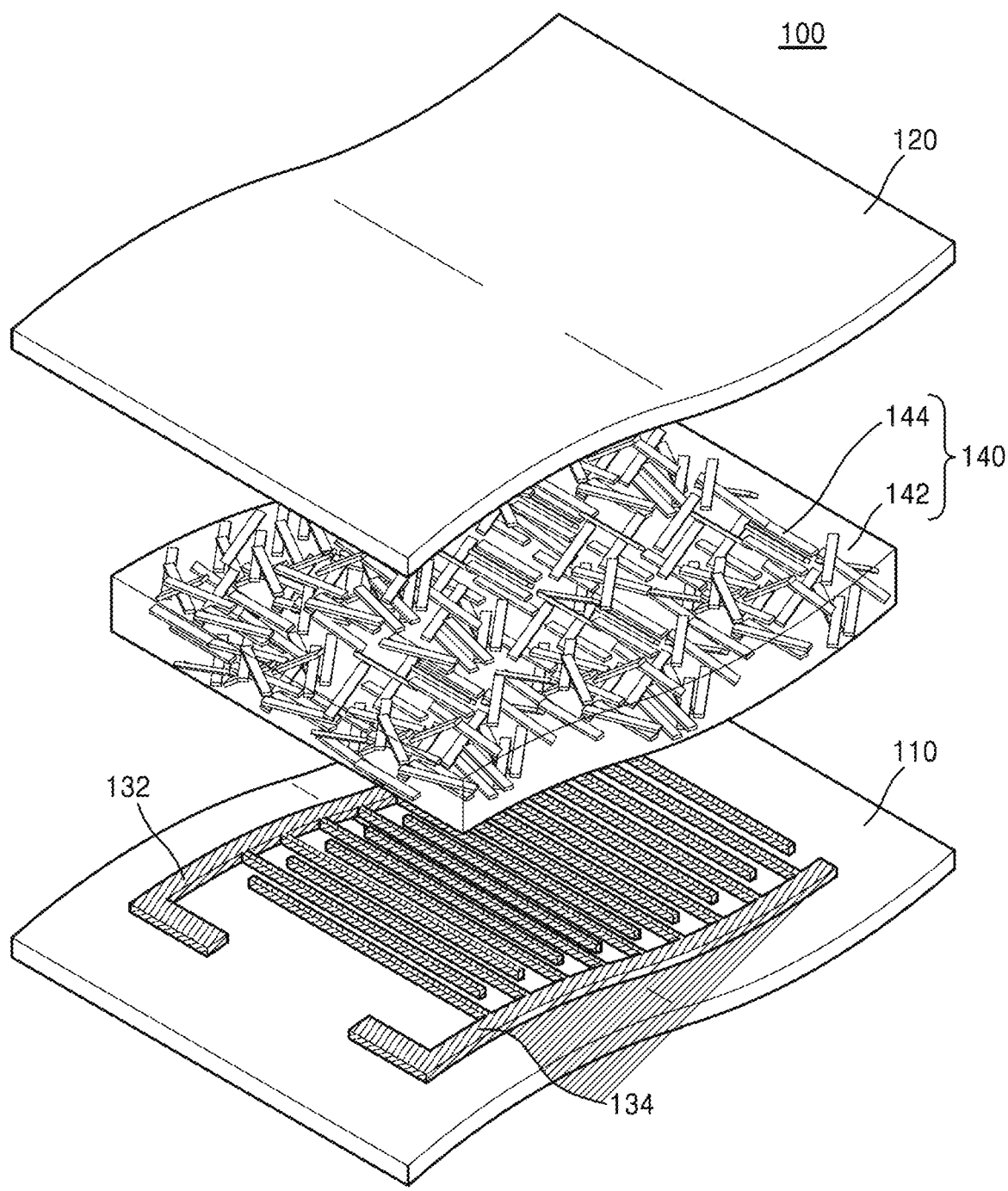
FIG. 1D is an exploded perspective view illustrating a first substrate and a second substrate in a pressure sensor according to an embodiment of the present inventive concept.

FIG. 1D is an exploded perspective view illustrating the first substrate 110 and the second substrate 120 in the pressure sensor 100 described with reference to FIGS. 1A, 1B, and 1C includes a flexible substrate. Specific constituent materials of the first substrate 110 and the second substrate 120, each including a flexible substrate, are described with reference to FIGS. 1A and 1B.

Figure 2:
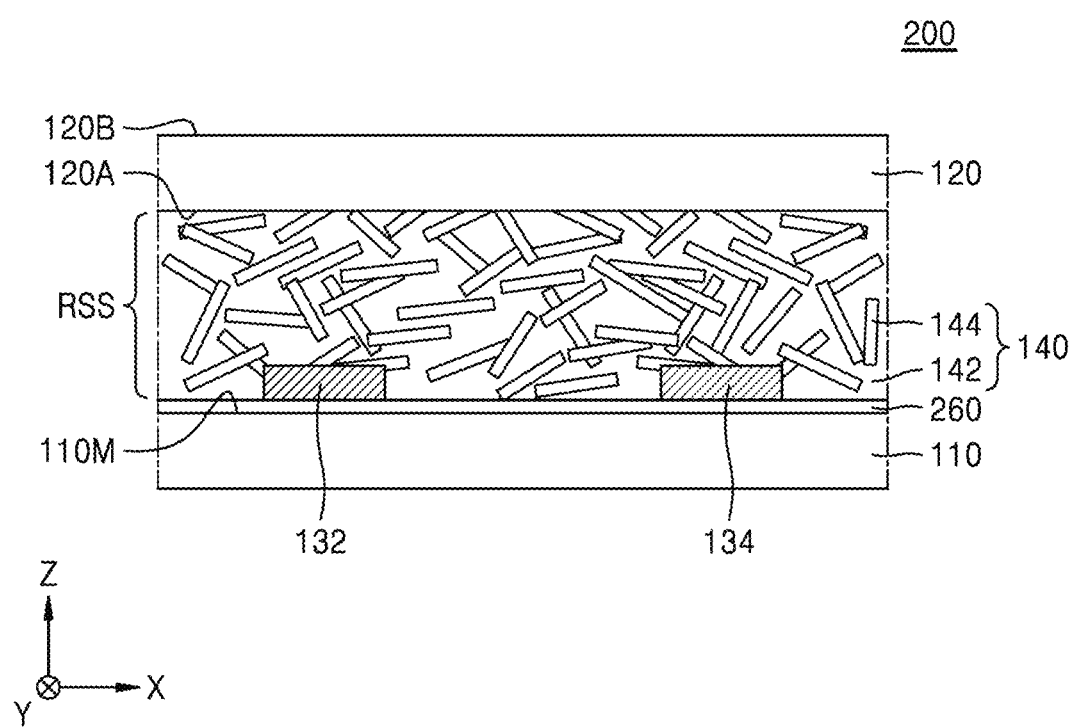
FIG. 2 is a cross-sectional view of a pressure sensor according to an embodiment of the present inventive concept.

Each of the first substrate 110 and the second substrate 120 includes a flexible substrate, and thus, the pressure sensor 100 may be flexible. Therefore, the pressure sensor 100 may be applied in configuring various sensors that require flexibility, for example, sensors for detecting physiological signals, such as electrocardiogram, impedance plethysmogram, photoplethysmogram, and phonocardiogram waveforms, FIG. 2 is a cross-sectional view of a pressure sensor 200 according to an embodiment of the present inventive concept. In FIG. 2, the same reference numerals as in FIGS. 1A to 1D respectively denote the same members, and repeated descriptions thereof may be omitted.

Referring to FIG. 2, the pressure sensor 200 has substantially the same configuration as the pressure sensor 100 described with reference to FIGS. 1A to 1D. However, the pressure sensor 200 further includes an insulating passivation layer 260 between the first substrate 110 and both the first electrode 132 and the second electrode 134.

The insulating passivation layer 260 may suppress unintended reaction between the first substrate 110 and both the first electrode 132 and the second electrode 134 in forming the first electrode 132 and the second electrode 134 and may secure solvent orthogonality, whereby the insulating passivation layer 260 may prevent damage to the first substrate 110 and allow the first electrode 132 and the second electrode 134 to maintain intended shapes thereof.

The insulating passivation layer 260 may include a material that is different from the constituent material of the first substrate 110. In an embodiment of the present inventive concept, the insulating passivation layer 260 may include, but is not limited to poly(4-vinylphenol) (PVP).

For example, the lower surface of the insulating passivation layer 260 may contact the main surface 110M of the first substrate 110. The upper surface of the insulating passivation layer 260 may contact the lower surface of each of the first electrode 132 and the second electrode 134.

Figure 3A:
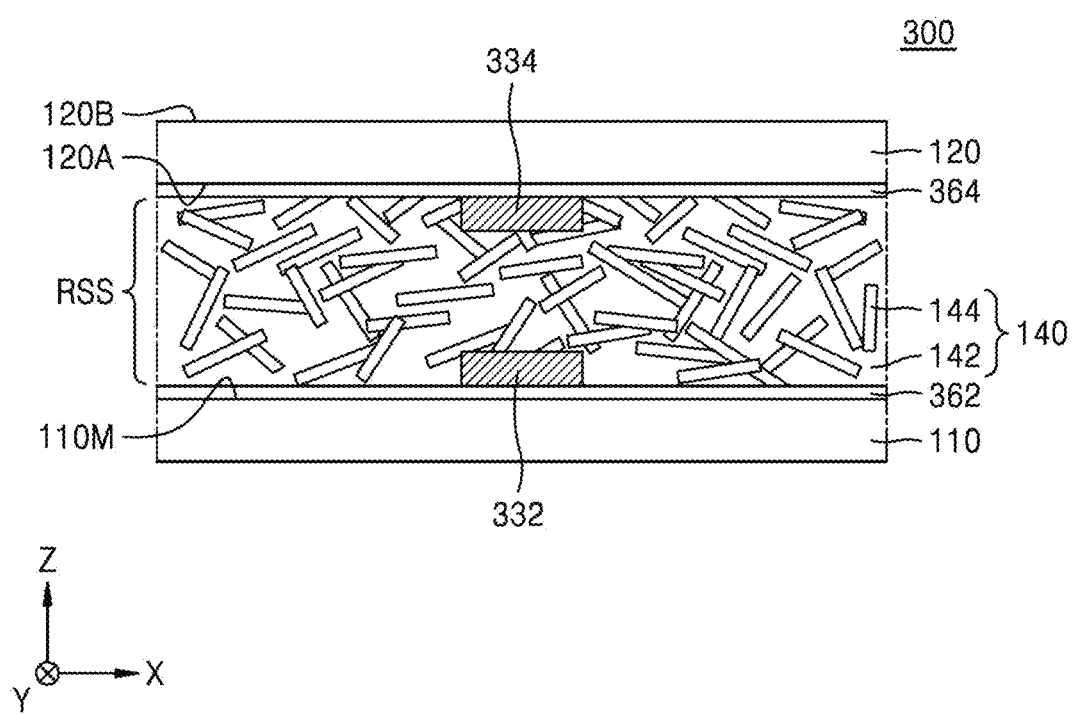
FIG. 3A is a cross-sectional view of a pressure sensor according to an embodiment of the present inventive concept.

FIG. 3A is a cross-sectional view of a pressure sensor 300 according to an embodiment of the present inventive concept. In FIG. 3A, the same reference numerals as in FIGS. 1A to 1D respectively denote the same members, and repeated descriptions thereof may be omitted.

Referring to FIG. 3A, the pressure sensor 300 has substantially the same configuration as the pressure sensor 100 described with reference to FIGS. 1A to 1D. However, the pressure sensor 300 includes a first electrode 332 and a second electrode 334, which are arranged in the resistance sensing space RSS to overlap each other in the vertical direction (e.g., the Z direction) with respect to the main surface 110M of the first substrate 110, and the first electrode 332 and the second electrode 334 are arranged to face each other with the piezoresistive pattern 140 therebetween.

The first electrode 332 may be arranged adjacent to the first substrate 110, and the second electrode 334 may be arranged adjacent to the second substrate 120. Constituent materials of the first electrode 332 and the second electrode 334 are substantially the same as those of the first electrode 132 and the second electrode 134, which are described with reference to FIGS. 1A and 1B.

In an embodiment of the present inventive concept, the pressure sensor 300 may further include a first insulating passivation layer 362 disposed between the first substrate 110 and the first electrode 332, and a second insulating passivation layer 364 disposed between the second substrate 120 and the second electrode 334. The function and constituent material of each of the first insulating passivation layer 362 and the second insulating passivation layer 364 are substantially the same as those of the insulating passivation layer 260 described with reference to FIG. 2. In an embodiment of the present inventive concept, at least one of the first insulating passivation layer 362 and the second insulating passivation layer 364 may be omitted.

Figure 3B:
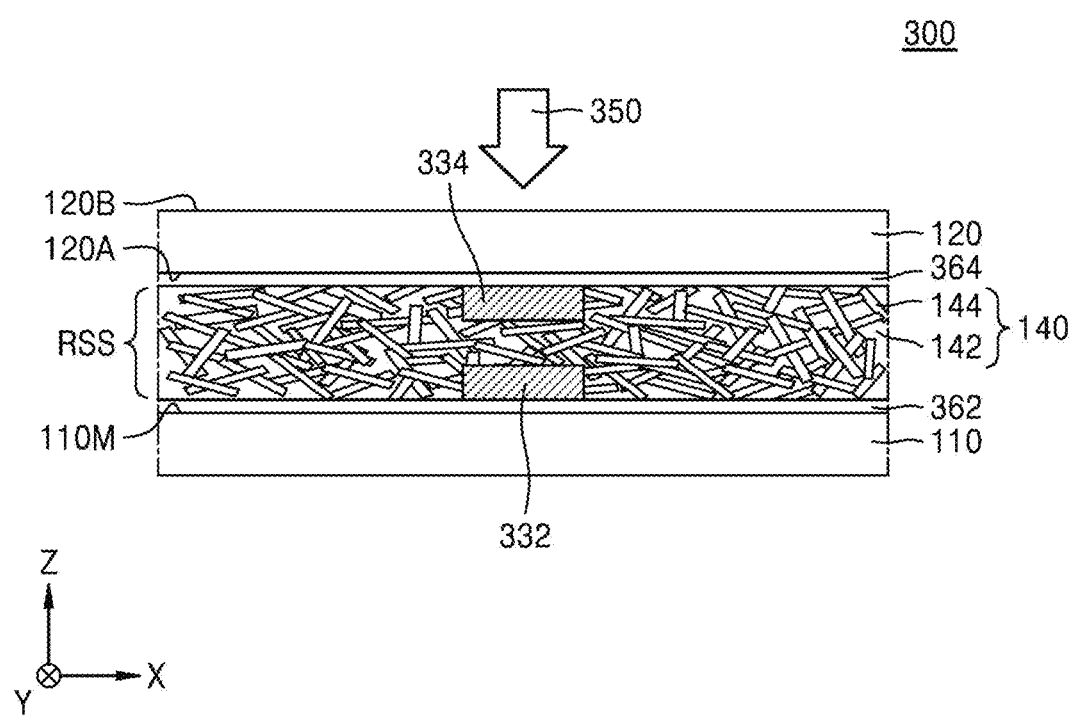
FIG. 3B is a cross-sectional view illustrating a structure of the pressure sensor of FIG. 3A when a physical stimulus is applied to the pressure sensor from outside the pressure sensor.

FIG. 3B is a cross-sectional view illustrating a structure of the pressure sensor 300 of FIG. 3A when a physical stimulus 350 is applied to the touch surface 120B of the second substrate 120 from outside the pressure sensor 300.

Referring to FIG. 3B, similar to the description made regarding the pressure sensor 100 with reference to FIG. 1C, when the physical stimulus 350 is applied to the touch surface 120B of the second substrate 120 from outside the pressure sensor 300 and the porous elastic support 142 in the piezoresistive pattern 140 is contraction-deformed or compressed by the external physical stimulus 350, adjacent conductive carbon structures 144 from among the plurality of conductive carbon structures 144 are brought into contact with each other, and thus, a conductive path may be formed between the first electrode 332 and the second electrode 334. In addition, when the application of the physical stimulus 350 is released from the touch surface 120B of the second substrate 120, the porous elastic support 142 may be restored to a state before the physical stimulus 350 is applied, and the plurality of conductive carbon structures 144 may also be restored to positions before the physical stimulus 350 is applied. Accordingly, a resistance change in the pressure sensor 300 may be induced by the presence or not or by a magnitude change of the physical stimulus 350 applied to the touch surface 120B of the second substrate 120 from outside the pressure sensor 300.

Figure 4:
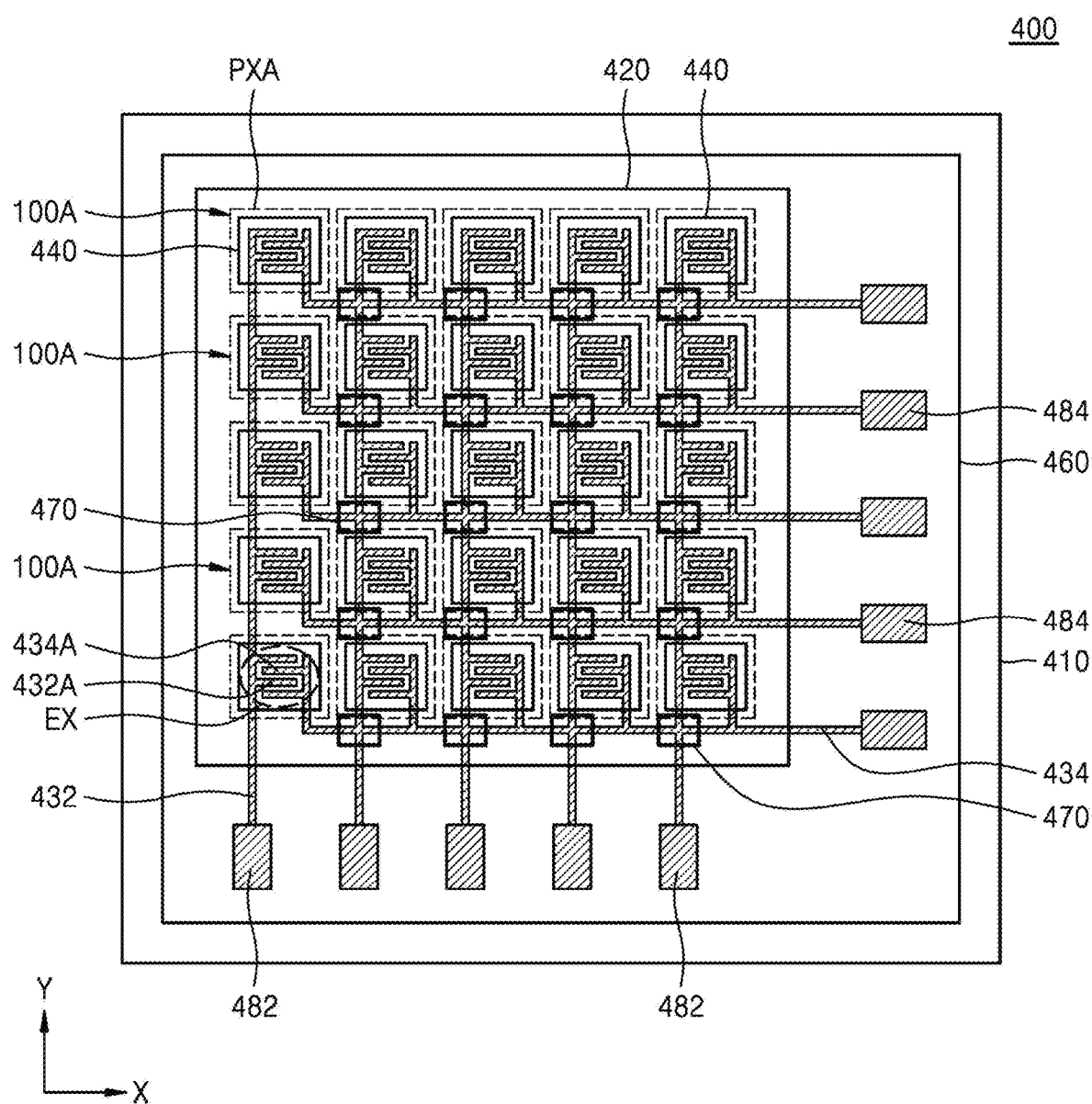
FIG. 4 is a planar layout diagram of a pressure sensor pixel array according to an embodiment of the present inventive concept.

FIG. 4 is a planar layout diagram of a pressure sensor pixel array 400 according to an embodiment of the present inventive concept. In FIG. 4, the same reference numerals as in FIGS. 1A to 1D and 2 respectively denote the same members, and repeated descriptions thereof may be omitted.

Referring to FIG. 4, the pressure sensor pixel array 400 may include a first substrate 410 and a second substrate 420, which face each other and are spaced apart from each other with a resistance sensing space therebetween. More detailed configurations of the first substrate 410 and the second substrate 420 are substantially the same as those of the first substrate 110 and the second substrate 120 described with reference to FIGS. 1A and 1B, respectively.

The planar area of the resistance sensing space disposed between the first substrate 410 and the second substrate 420 may be defined by the planar area of the second substrate 420. A plurality of pixel areas PXA may be arranged in the resistance sensing space between the first substrate 410 and the second substrate 420. The plurality of pixel areas PXA may be arranged apart from each other in a horizontal direction (for example, the X direction and the Y direction in FIG. 4). In an embodiment of the present inventive concept, the plurality of pixel areas PXA may be arranged in a matrix form in the first horizontal direction (X direction) and the second horizontal direction (Y direction), which intersect each other, on the first substrate 410.

The pressure sensor pixel array 400 may include a plurality of pressure sensors 100A. One pressure sensor 100A of the plurality of pressure sensors 100A may be arranged in each of the plurality of pixel areas PXA. Accordingly, the plurality of pressure sensors 100A may also be arranged in a matrix form in the first horizontal direction (X direction) and the second horizontal direction (Y direction), which intersect each other, on the first substrate 410.

In the pressure sensor pixel array 400, a plurality of piezoresistive patterns 440 may be arranged spaced apart from each other and between the first substrate 410 and the second substrate 420. The plurality of piezoresistive patterns 440 may be arranged spaced apart from each other to respectively correspond to the plurality of pixel areas PXA, in a one-to-one manner. The planar area of each of the plurality of pixel areas PXA may be defined by the planar area of one piezoresistive pattern 440 corresponding thereto from among the plurality of piezoresistive patterns 440.

The pressure sensor pixel array 400 may include a plurality of first electrode lines 432 and a plurality of second electrode lines 434, and both the plurality of first electrode lines 432 and the plurality of second electrode lines 434 cover the plurality of pixel areas PXA. The plurality of first electrode lines 432 may extend lengthwise in the second horizontal direction (Y direction) and may be repeatedly arranged apart from each other in the first horizontal direction (X direction). The plurality of second electrode lines 434 may extend lengthwise in the first horizontal direction (X direction) and may be repeatedly arranged apart from each other in the second horizontal direction (Y direction). A first electrode line 432 and a second electrode line 434 may be arranged horizontally apart from each other in each of the plurality of pixel areas PXA.

Pressure sensors 100A of a first group, which are adjacent to each other in a length direction (e.g., the Y direction in FIG. 4) of one first electrode line 432, from among the plurality of pressure sensors 100A may be connected to each other via the one first electrode line 432. Pressure sensors 100A of a second group, which are adjacent to each other in a length direction (e.g., the X direction in FIG. 4) of one second electrode line 434, from among the plurality of pressure sensors 100A may be connected to each other via the one second electrode line 434.

In a location in which one of the plurality of first electrode lines 432 intersects with one of the plurality of second electrode lines 434, an inter-electrode insulating pattern 470 may be arranged between the first electrode line 432 and the second electrode line 434. A constituent material of the inter-electrode insulating pattern 470 is not particularly limited so long as the constituent material includes an insulating material. For example, the inter-electrode insulating pattern 470 may include PVP.

The plurality of first electrode lines 432 and the plurality of second electrode lines 434 may intersect each other at a plurality of points on the first substrate 410, and thus, a plurality of inter-electrode insulating patterns 470 may be arranged on the first substrate 410 at the plurality of points. The plurality of points, at which the plurality of first electrode lines 432, and the plurality of second electrode lines 434 intersect each other on the first substrate 410, may be respectively located in local regions outside the plurality of pixel areas PXA. Accordingly, the plurality of inter-electrode insulating patterns 470 may be respectively arranged in the local regions outside the plurality of pixel areas PXA, on the first substrate 410.

As in, for example, a region EX marked by a dashed line in FIG. 4, the plurality of first electrode lines 432 may include a plurality of first local electrodes 432A respectively arranged in correspondence with the plurality of pixel areas PXA, and the plurality of second electrode lines 434 may include a plurality of second local electrodes 434A respectively arranged in correspondence with the plurality of pixel areas PXA.

In each of the plurality of pixel areas PXA, a first local electrode 432A of the first electrode line 432 and a second local electrode 434A of the second electrode line 434 may constitute interdigitated electrodes. In each of the plurality of pixel areas PXA, the pezoresistive pattern 440 may contact the first local electrode 432A of the first electrode line 432 and the second local electrode 434A of the second electrode line 434.

In the pressure sensor pixel array 400, because the plurality of piezoresistive patterns 440 are arranged apart from each other to respectively correspond one-to-one to the plurality of pixel areas PXA, electrical cross-talk between the plurality of pixel areas PXA may be prevented.

The second substrate 420 may be spaced apart from the plurality of first local electrodes 432A and the plurality of second local electrodes 434A with the plurality of piezoresistive patterns 440 therebetween. The second substrate 420 may face the first substrate 410 with the plurality of first electrode lines 432, the plurality of second electrode lines 434, and the plurality of piezoresistive patterns 440 therebetween.

More detailed configurations of the first substrate 410, the second substrate 420, the plurality of first electrode lines 432, the plurality of second electrode lines 434, and the plurality of piezoresistive patterns 440 are substantially the same as those of the first substrate 110, the second substrate 120, the first electrode 132, the second electrode 134, and the piezoresistive pattern 140 described with reference to FIGS. 1A and 1B, respectively.

In an example embodiment of the present inventive concept, an insulating passivation layer 460 may be arranged between the first substrate 410 and both the plurality of first local electrodes 432A and the plurality of second local electrodes 434A. A more detailed configuration and an effect of the insulating passivation layer 460 are substantially the same as those of the insulating passivation layer 260 described with reference to FIG. 2. In an example embodiment of the insulating passivation layer 460 in the pressure sensor pixel array 400 may be omitted.

As shown in FIG. 4, a first electrode pad 482 for applying signals to or reading signals from each of the plurality of first electrode lines 432 may be connected to one end of each of the plurality of first electrode lines 432. The first electrode pad 482 may include, but is not limited to, the same material as the plurality of first electrode lines 432. In addition, a second electrode pad 484 for applying signals to or reading signals from each of the plurality of second electrode lines 434 may be connected to one end of each of the plurality of second electrode lines 434. The second electrode pad 484 may include, but is not limited to, the same material as the plurality of second electrode lines 434.

Although FIG. 4 illustrates an example in which the pressure sensor pixel array 400 has a 5×5 pixel matrix structure, this is merely an example, and the number and arrangement of pixel areas PXA in the pressure sensor pixel array 400 may be variously modified and changed without departing from the spirit and scope of the present inventive concept.

Figure 5:
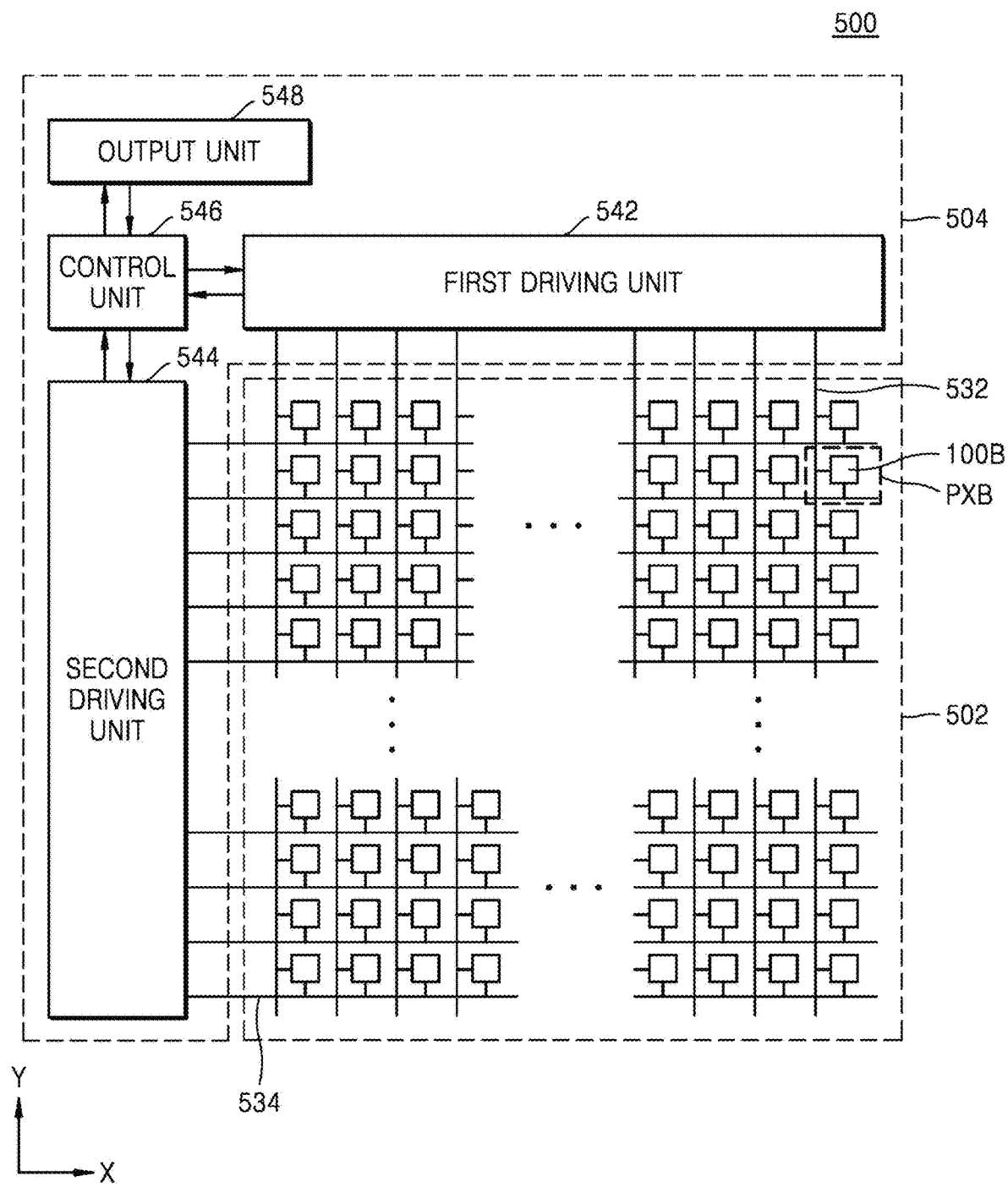
FIG. 5 is a conceptual diagram illustrating an electronic system according to an embodiment of the present inventive concept.

FIG. 5 is a conceptual diagram illustrating an electronic system 500 according to an embodiment of the present inventive concept.

Referring to FIG. 5, the electronic system 500 may include a resistance sensing unit 502 and a peripheral circuit unit 504.

The resistance sensing unit 502 may include a plurality of pixels PXB arranged in a 2-dimensional matrix. The plurality of pixels PXB may be arranged spaced apart from each other in a horizontal direction (for example, the X direction and the Y direction in FIG. 5). A plurality of pressure sensors 100B may be arranged in the resistance sensing unit 502. One pressure sensor 100B of the plurality of pressure sensors 100B may be arranged in each of the plurality of pixels PXB.

The resistance sensing unit 502 may be connected to the peripheral circuit unit 504 via a plurality of first electrode lines 532 and a plurality of second electrode lines 534. Pressure sensors 100B of a first group, which are adjacent to each other in a column direction (e.g., the Y direction in FIG. 5), from among the plurality of pressure sensors 100B may be connected to each other via one first electrode line 532. Pressure sensors 100B of a second group, which are adjacent to each other in a row direction (e.g., the X direction in FIG. 5), from among the plurality of pressure sensors 100B may be connected to each other via one second electrode line 534.

In an embodiment of the present inventive concept, the resistance sensing unit 502 may have a similar structure to the pressure sensor pixel array 400 described with reference to FIG. 4. However, the number of pixels PXB in the resistance sensing unit 502 may vary. For example, the resistance sensing unit 502 may have a 48×48 pixel matrix form that is arranged in a 2-dimensional array structure. Each of the plurality of pressure sensors 100B in the resistance sensing unit 502 may have a structure selected from the pressure sensor 100 described with reference to FIGS. 1A to 1D, the pressure sensor 200 described with reference to FIG. 2, the pressure sensor 300 described with reference to FIGS. 3A and 3B, and pressure sensors variously modified and changed therefrom without departing from the spirit and scope of the present inventive concept.

The peripheral circuit unit 504 may include a first driving unit 542, a second driving unit 544, a control unit 546, and an output unit 548.

In an embodiment of the present inventive concept, the first driving unit 542 may select at least one from among the plurality of first electrode lines 532 connected to the plurality of pixels PXB and supply a reference voltage to a selected pixel PXB from among the plurality of pixels PXB via the selected at least one first electrode line 532. In embodiment of the present inventive concept, the first driving unit 542 may sequentially supply the reference voltage to the plurality of pixels PXB in the resistance sensing unit 502 in the row direction on a column basis. In an embodiment of the present inventive concept, resistance change data sensed by the resistance sensing unit 502 may be supplied to the second driving unit 544 via the plurality of second electrode lines 534. In an embodiment of the present inventive concept, the second driving unit 544 may include a correlated-double sampling (CDS) circuit, a signal amplifying circuit, an analog-to-digital converter (ADC) circuit, and the like. The CDS circuit may be for removing noise intrinsic to a pixel PXB.

The control unit 546 may generate clock signals or control signals, which are references of operations of the first driving unit 542 and/or the second driving unit 544, and input the clock signals or the control signals to the first driving unit 542 and/or the second driving unit 544.

The output unit 548 may perform signal processing on signals transferred from the control unit 546 and output the signals. In an embodiment of the present inventive concept, the output unit 548 may perform amplification or may perform signal processing operations other than the amplification. For example, the output unit 548 may perform various digital signal processing operations, such as level adjustment, non-uniformity correction, and the like, on the signals transferred from the control unit 546.

The electronic system 500 may generate an electrical signal or a data value, which corresponds to a change in an environment that is external to a sensing target. In an embodiment of the present inventive concept, the electronic system 500 may constitute a proximity sensor, a fingerprint sensor, or a bio-sensor. The bio-sensor may constitute, for example, sensors for detecting physiological signals, such as electrocardiogram, impedance plethysmogram, photoplethysmogram, and phonocardiogram waveforms.

Figure 6:
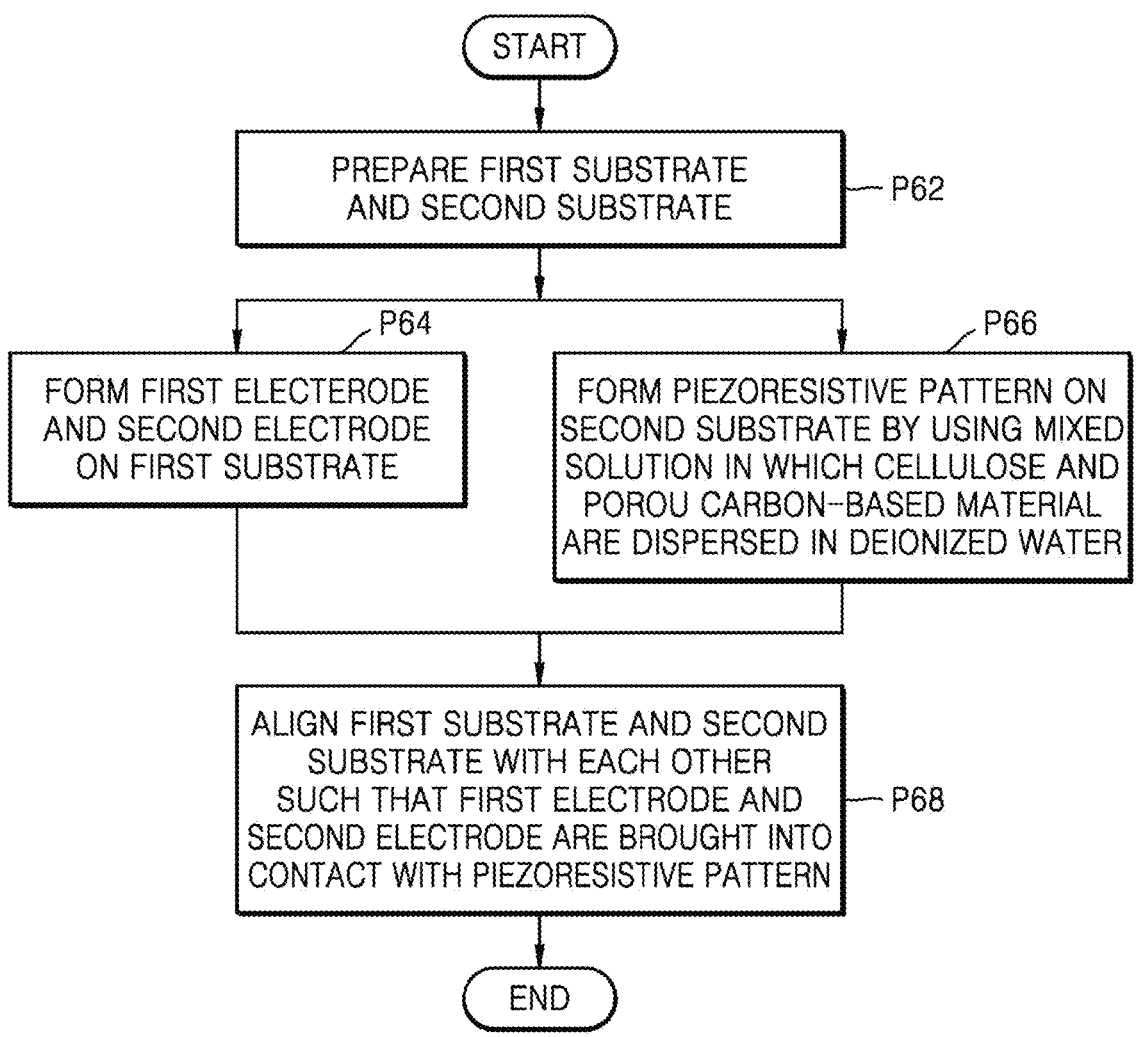
FIG. 6 is a flowchart illustrating a method of fabricating a pressure sensor, according to an embodiment of the present inventive concept.

FIG. 6 is a flowchart illustrating a method of fabricating a pressure sensor, according to an embodiment of the present inventive concept. FIGS. 7A to 7E are perspective views illustrating a sequence of processes of a method of fabricating a pressure sensor, according to an embodiment of the present inventive concept. Methods of fabricating the pressure sensors 100 and 200 shown in FIGS. 1A to 1D and FIG. 2 will be described with reference to FIGS. 6 and 7A to 7E as examples.

Referring to FIGS. 1A to 1D, 2, and 6, in process P62, the first substrate 110 and the second substrate 120 may be prepared.

Figure 7A:
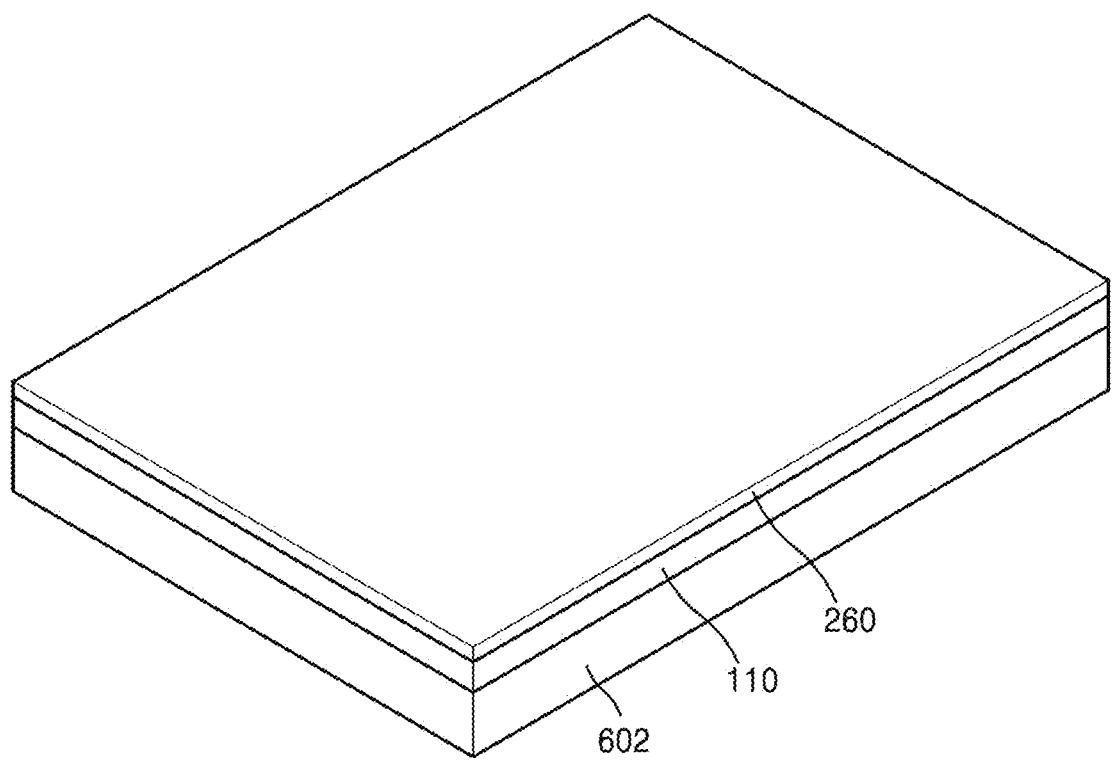
FIGS. 7A, 7B, 7C, 7D and 7E are perspective views illustrating a sequence of processes of a method of fabricating a pressure sensor, according to an embodiment of the present inventive concept.
Figure 7B:
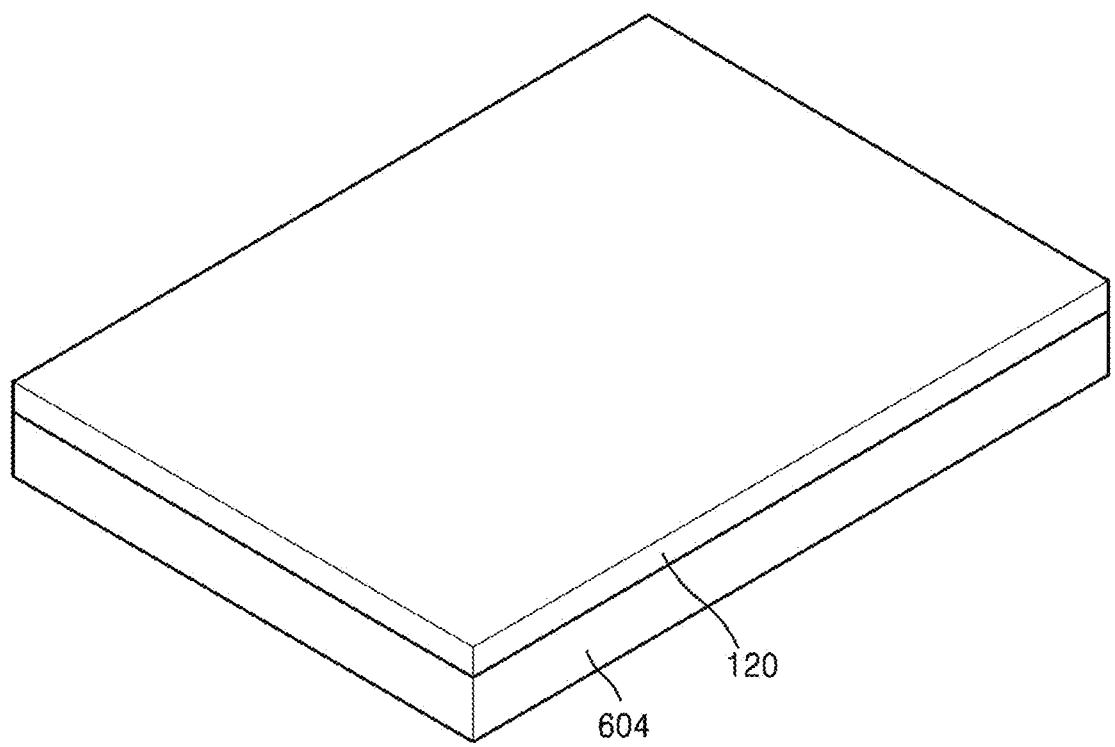

As shown in FIGS. 7A and 7B, to prepare each of the first substrate 110 and the second substrate 120, an insulating polymer solution may be spin-coated on glass substrates 602 and 604, thereby forming a coating film. Next, the first substrate 110 and the second substrate 120, each including an insulating polymer, may be formed by annealing the coating film.

To fabricate the pressure sensor 200 shown in FIG. 2, the first substrate 110 is formed on the glass substrate 602, as shown in FIG. 7A, and then, a process of forming the insulating passivation layer 260 on the first substrate 110 may be performed.

In an embodiment of the present inventive concept, to form the insulating passivation layer 260, a spin coating process may be used. For example, to form the insulating passivation layer 260, a PVP solution may be prepared by dissolving PVP powder and a curing agent in an organic solvent. Further, the PVP solution may be spin-coated on the first substrate 110, and then, an obtained resulting product may be annealed. In an embodiment of the present inventive concept, the curing agent may include, but is not limited to, poly(melamine-co-formaldehyde). In an embodiment of the present inventive concept, the organic solvent may include, but is not limited to, propylene glycol methyl ether acetate (PGMEA). When the pressure sensor 100 shown in FIGS. 1A to 1D is fabricated, the above-described process of forming the insulating passivation layer 260 may be omitted.

Figure 7C:
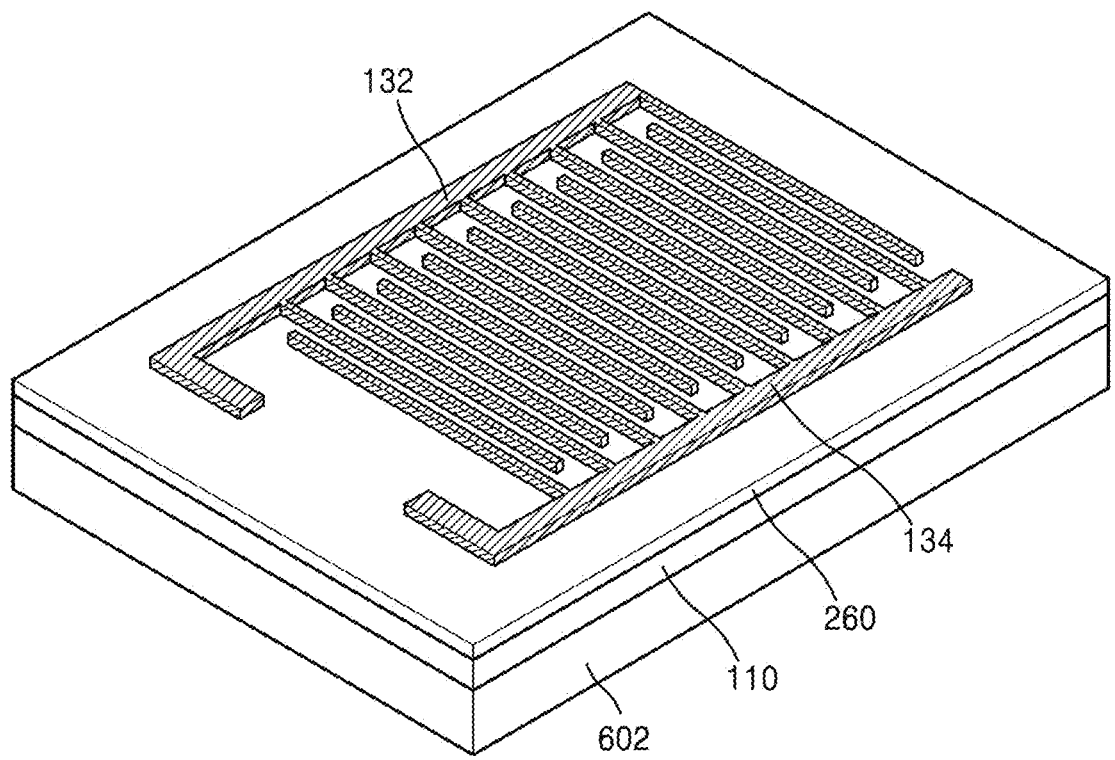

Referring to FIGS. 6 and 7C, in process P64, the first electrode 132 and the second electrode 134 may be formed on the first substrate 110.

To form the first electrode 132 and the second electrode 134 on the first substrate 110, a dry or wet process may be used. In an embodiment of the present inventive concept, to form the first electrode 132 and the second electrode 134 on the first substrate 110, an inkjet printing process, a screen printing process, a bar printing process, a roll-to-roll process, a chemical vapor deposition (CVD) process, an atomic layer deposition (ALD) process, a thermal evaporation process, a sputtering process, or a spin coating process may be used, but the present inventive concept is not limited thereto.

When the pressure sensor 200 shown in FIG. 2 is fabricated, the first electrode 132 and the second electrode 134 may be formed on the insulating passivation layer 260, as shown in FIG. 7C. When the pressure sensor 100 shown in FIGS. 1A to 1B is fabricated, the first electrode 132 and the second electrode 134 may be formed directly on the first substrate 110, unlike the example shown in FIG. 7C.

Figure 7D:
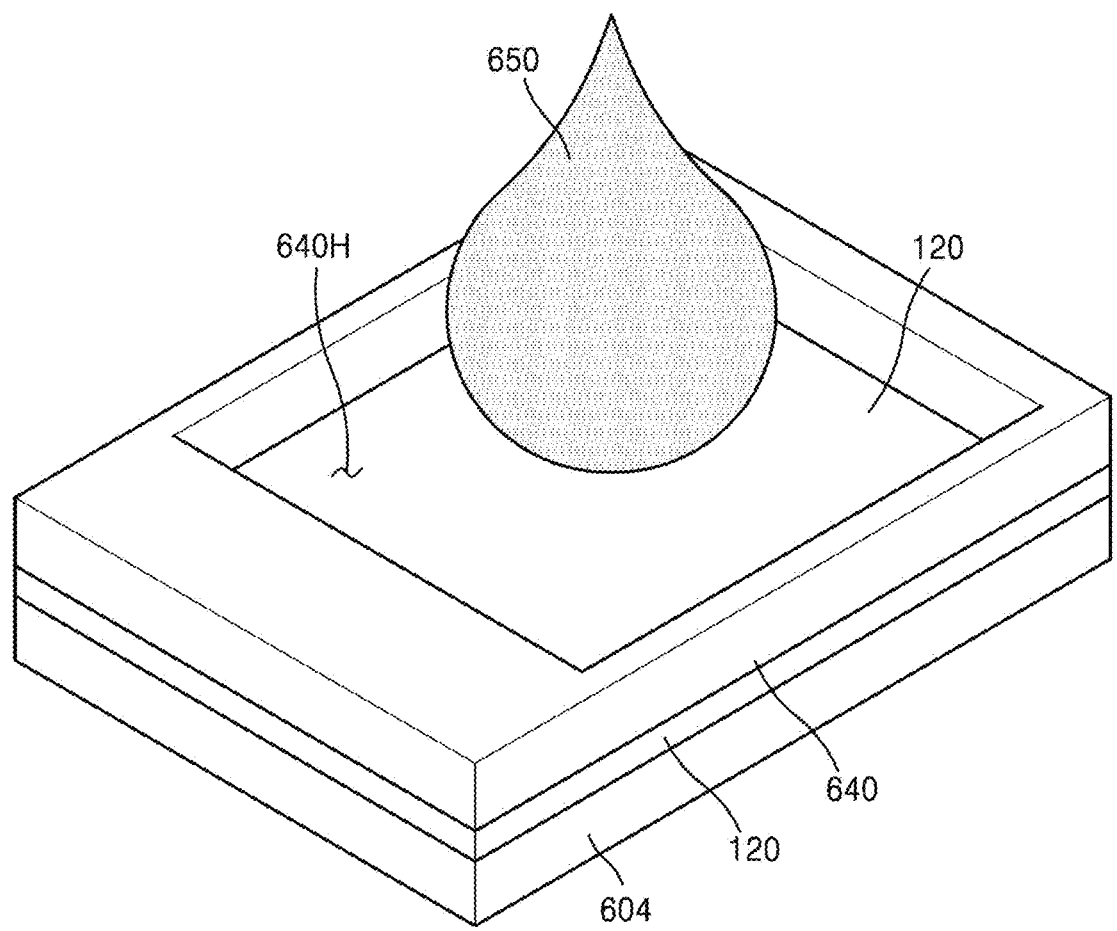
Figure 7E:
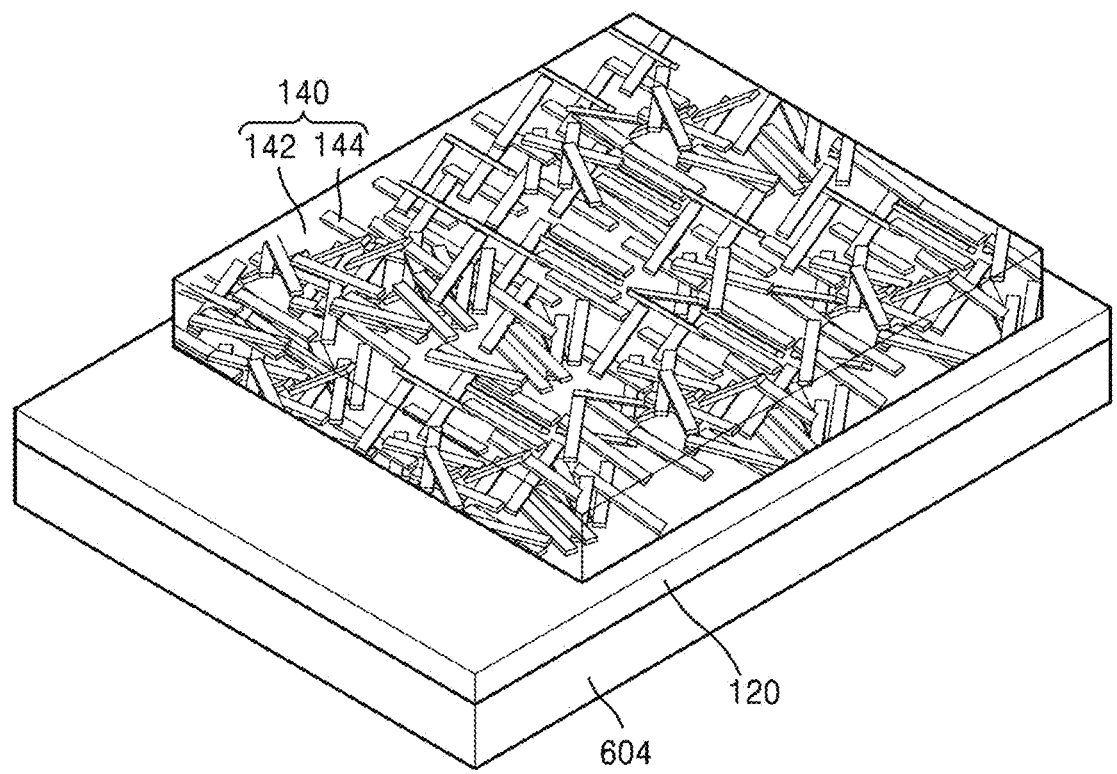

Referring to FIGS. 6, 7D, and 7E, in process P66, the piezoresistive pattern 140 may be formed on the second substrate 120 by using a mixed dispersion solution 650 in which cellulose and a porous carbon-based material are dispersed in deionized water.

To form the piezoresistive pattern 140 on the second substrate 120, a mask pattern 640 having an opening 640H, which exposes a certain portion of the second substrate 120, may be formed first on a resulting product of FIG. 7B, as shown in FIG. 7D. In an embodiment of the present inventive concept, the mask pattern 640 may include, but is not limited to, stainless use steel (SUS). Next, the mixed dispersion solution 650 may be applied onto the second substrate 120 by a spray coating process such that the opening 640H of the mask pattern 640 is filled with the mixed dispersion solution 650. In an embodiment of the present inventive concept, the mixed dispersion solution 650 may include a solution in which a plurality of conductive carbon structures and cellulose are uniformly dispersed in a weight ratio of about 1:20 to about 1:1 in deionized water. Next, deionized water may be evaporated from the mixed dispersion solution 650 by annealing. Next, the piezoresistive pattern 140 may remain to cover the certain portion of the second substrate 120, as shown in FIG. 7E, by removing the mask pattern 640. In the piezoresistive pattern 140, the plurality of conductive carbon structures 144 may remain dispersed in the porous elastic support 142. For example, the plurality of conductive carbon structures 144 may be irregularly dispersed in the porous elastic support 142.

Referring to FIG. 6, in process P68, the glass substrate 602 may be separated from the first substrate 110 in a resulting product of FIG. 7C, followed by separating the glass substrate 604 from the second substrate 120 in a resulting product of FIG. 7E, and then, the first substrate 110 and the second substrate 120 may be aligned with each other such that the first electrode 132 and the second electrode 134 contact the piezoresistive pattern 140. In an embodiment of the present inventive concept, the first substrate 110 and the second substrate 120 may be bonded to each other by using double-sided adhesive tape around the piezoresistive pattern 140. As a result, the pressure sensor 100 shown in FIGS. 1A to 1D or the pressure sensor 200 shown in FIG. 2 may be fabricated.

Heretofore, although, as an example, the methods of fabricating the pressure sensors 100 and 200 shown in FIGS. 1A to 1D and FIG. 2 have been described with reference to FIGS. 6 and 7A to 7E, it may be understood by those of ordinary skill in the art that the pressure sensors 300 and 400 shown in FIGS. 3A and 3B and FIG. 4 may be fabricated by making various modifications and changes to the methods described above as examples without departing from the spirit and scope of the present inventive concept.

Hereinafter, various evaluation examples of pressure sensors according to the present inventive concept will be described.

Evaluation Example 1

Formation of Piezoresistive Pattern

A single-walled carbon nanotube (SWCNT), which has a diameter of about 1 nm to about 2 nm, a length of about 5 µm to about 30 µm, and a purity of at least 95%, and which is surface-functionalized with a hydroxyl group, was used as a conductive carbon structure. A commercially available cellulose product (e.g., model: Sigmacell type-50) having a particle size of about 50 µm was used as cellulose.

About 8 mg of SWCNTs were added to deionized water, followed by separating SWCNT aggregates into small sizes for about 20 minutes by using a sonicator, and then, an obtained resulting product underwent addition of about 40 mg of cellulose thereto and dispersion for about 20 minutes with the sonicator again. Here, hydrogen bonds in molecules of cellulose may be broken by the hydroxyl groups of the SWCNTs that are surface-functionalized with the hydroxyl groups, and hydrogen bonds may be generated between the cellulose and the SWCNTs. By centrifuging an obtained resulting product at about 5000 rpm for 10 minutes, the SWCNTs and cellulose, which settled down without being dispersed, were separated and removed, thereby preparing a mixed dispersion solution of the SWCNTs and cellulose.

A PI solution was spin-coated on a first glass substrate at about 500 rpm for 1 minute, followed by sequentially annealing the coated PI solution at about 120° C., about 180° C., and about 250° C. in the stated order for 60 minutes for each temperature, thereby preparing a transparent upper PI substrate having a thickness of about 5 µm. Next, an SUS mask pattern having an opening was formed on the upper PI substrate, followed by spray-coating the mixed dispersion solution in the opening of the SUS mask pattern and sufficiently drying the coated mixed dispersion solution, and then, the SUS mask pattern was removed, thereby forming a piezoresistive pattern to cover a certain portion of the upper PI substrate. The obtained piezoresistive pattern had a thickness of about 350 nm. Next, the first glass substrate was removed from the upper PI substrate.

Figure 8A:
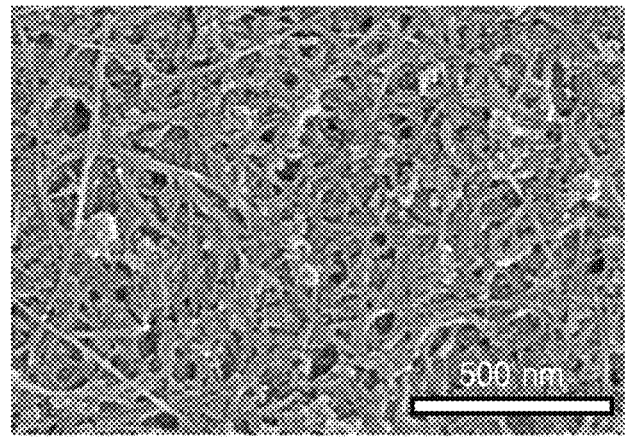
FIG. 8A is a planar scanning electron microscopy (SEM) image of a piezoresistive pattern in a pressure sensor, according to an embodiment of the present inventive concept.
Figure 8B:
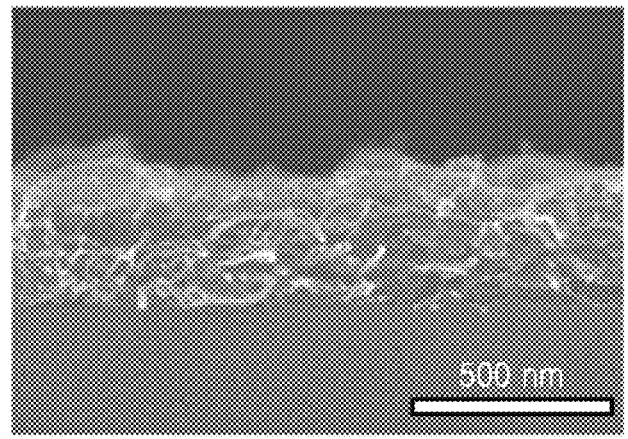
FIG. 8B is a cross-sectional SEM image of a piezoresistive pattern in a pressure sensor, according to an embodiment of the present inventive concept.

FIG. 8A is a planar scanning electron microscopy (SEM) image of the piezoresistive pattern obtained in Evaluation Example 1, and FIG. 8B is a cross-sectional SEM image of the piezoresistive pattern obtained in Evaluation Example 1.

As can be seen in FIGS. 8A and 8B, the piezoresistive pattern obtained in Evaluation Example 1 has a porous structure in which the SWCNTs and cellulose are stacked while intertwining with each other. As such, the Young's modulus of the piezoresistive pattern may be reduced due to the porous structure of the piezoresistive pattern, and thus, the piezoresistive pattern may be applied in configuring various sensors that require flexibility.

Evaluation Example 2

Fabrication of Pressure Sensor

A PI solution was spin-coated on a second glass substrate at about 500 rpm for 1 minute, followed by sequentially annealing the coated PI solution at about 120° C., about 180° C., and about 250° C. in the stated order for 60 minutes for each temperature, thereby preparing a transparent lower PI substrate having a thickness of about 5 μm. A PVP solution was spin-coated on the lower PI substrate at about 1000 rpm and then annealed on a hot plate at about 100° C. for 20 minutes and subsequently at about 200° C. for 30 minutes, thereby forming an insulating passivation layer. As the PVP solution, a solution obtained by dissolving about 10 wt % of PVP powder and about 2 wt % of poly(melamine-co-formaldehyde) in PGMEA was used. Next, a silver (Ag) electrode layer was formed on the insulating passivation layer by using an inkjet printer and then annealed at about 120° C. for 60 minutes, thereby forming an interdigitated electrode having 8 pairs of finger portions (e.g., protrusions), which were spaced apart from each other at intervals of about 200 μm.

Next, the second glass substrate was removed from the lower PI substrate, followed by aligning the upper PI substrate and the lower PI substrate with each other such that the piezoresistive pattern fabricated in Evaluation Example 1 contacts the interdigitated electrode, and then, the upper PI substrate was bonded to the insulating passivation layer by using double-sided adhesive tape having a thickness of about 20 μm, thereby fabricating a pressure sensor.

Evaluation Example 3

Evaluation of Characteristics of Pressure Sensor

Figure 9A:
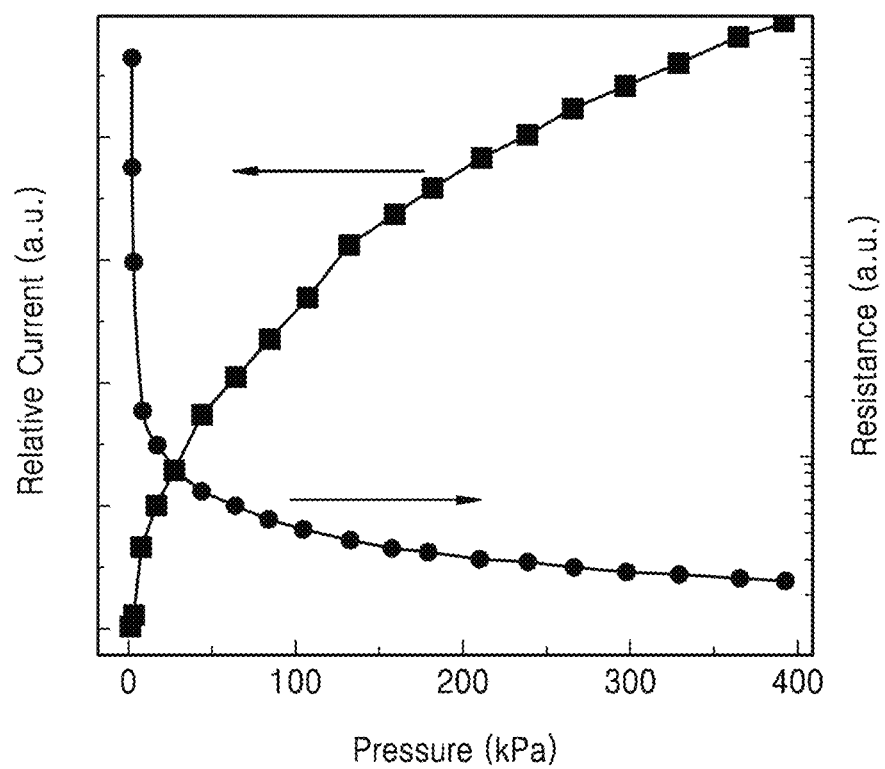
FIG. 9A is a graph depicting relative changes in current and resistance according to pressure when various magnitudes of pressure are applied to a pressure sensor, according to an embodiment of the present inventive concept.
Figure 9B:
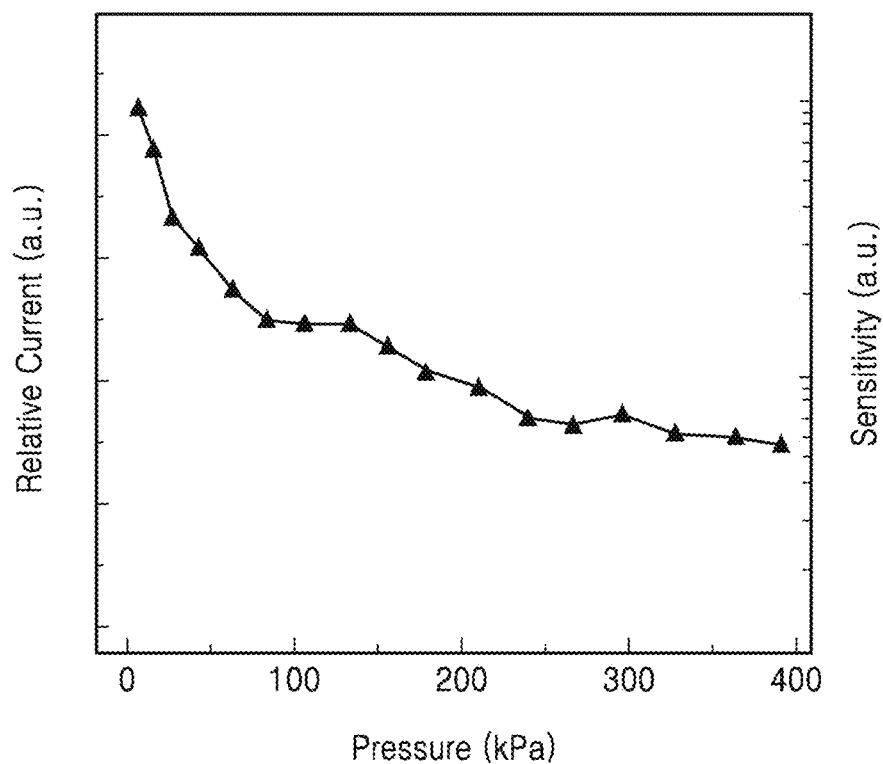
FIG. 9B is a graph depicting sensitivity of a pressure sensor, according to an embodiment of the present inventive concept.

FIG. 9A is a graph depicting relative changes in current and resistance according to pressure when various magnitudes of pressure are applied to the pressure sensor fabricated in Evaluation Example 2, and FIG. 9B is a graph depicting sensitivity obtained from the gradient of the relative change in current of FIG. 9A.

From the results of FIGS. 9A and 9B, it can be confirmed that the pressure sensor fabricated in Evaluation Example 2 has a high sensitivity according to changes in pressure applied with various magnitudes in a measured pressure range.

Figure 10:
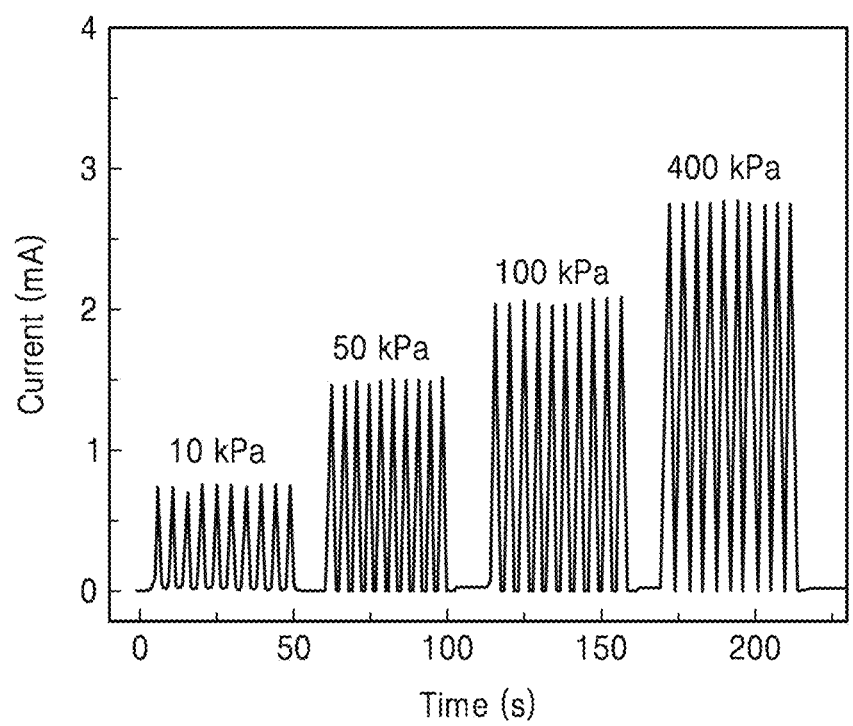
FIG. 10 is a graph depicting a result of evaluating response characteristics from current changes obtained when various pressures are applied to a pressure sensor for various time periods, according to an embodiment of the present inventive concept.

FIG. 10 is a graph depicting a result of evaluating response characteristics from current changes obtained when pressures of 10 kPa, 50 kPa, 100 kPa, and 400 kPa were applied to the pressure sensor fabricated in Evaluation Example 2 for various time periods.

As can be seen from the results of FIG. 10, the pressure sensor fabricated in Evaluation Example 2 exhibited stable and distinct current characteristics at various pressures that were measured.

Figure 11:
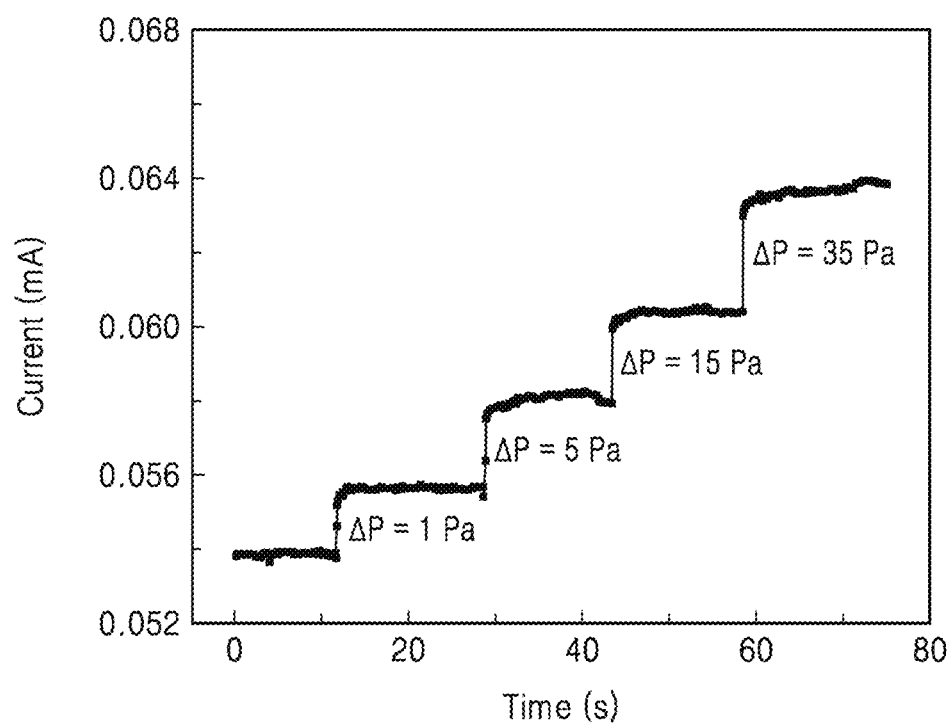
FIG. 11 is a graph depicting a result of measuring a change in current when a relatively small magnitude difference is generated in pressure applied to a pressure sensor, according to an embodiment the present inventive concept.

FIG. 11 is a graph depicting a result of measuring a change in current when a relatively small magnitude difference of 0 Pa to 35 Pa is generated in the pressure applied to the pressure sensor fabricated in Evaluation Example 2.

As can be seen from the results of FIG. 11, it can be seen that a clearly distinct electrical signal may be obtained even for an extremely small change in pressure of a few Pa.

In addition, in the pressure sensor according to the present inventive concept, with the decreasing width of each of the plurality of finger portions constituting the interdigitated electrode in the pressure sensor, with the increasing interval between the plurality of finger portions, with the decreasing amount of the conductive carbon structure in the piezoresistive pattern in the pressure sensor, and with the decreasing thickness of the piezoresistive pattern, the transmittance of the pressure sensor has increased.

Figure 12:
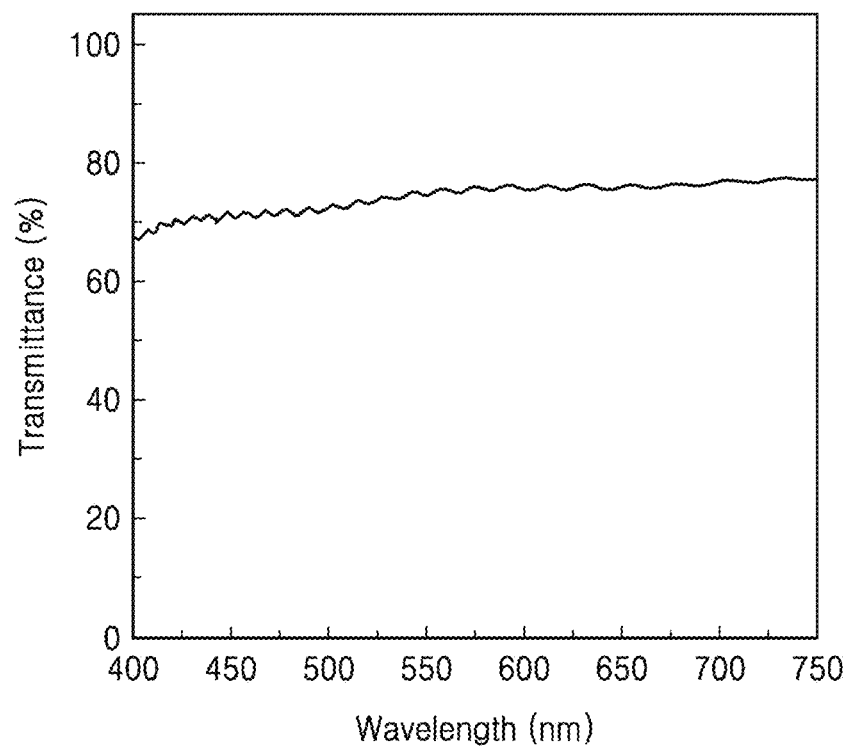
FIG. 12 is a graph depicting a result of evaluating transmittance properties of a pressure sensor in a visible light range, according to an embodiment of the present inventive concept.

FIG. 12 is a graph depicting a result of evaluating transmittance properties of a pressure sensor in a visible light range, according to an embodiment of the present inventive concept.

For the evaluation of FIG. 12, a pressure sensor was fabricated by a similar method to that in Evaluation Examples 1 and 2. However, in the pressure sensor used in the evaluation of FIG. 12, the thickness of the piezoresistive pattern was about 98.6 nm, and the interval between the plurality of finger portions in the interdigitated electrode was about 600 μm.

From the results of FIG. 12, it can be confirmed that the pressure sensor has a transmittance of at least 70% in a visible light wavelength range of about 450 nm to about 750 nm, and for example, has a transmittance of about 75% at a wavelength of about 550 nm.

As can be seen from the above results, according to an embodiment of the present inventive concept, by variously setting conditions of components constituting a pressure sensor according to purposes of use of the pressure sensor, pressure sensors having various ranges of transmittance may be implemented.

Evaluation Example 4

Evaluation of Characteristics of Electronic System

FIGS. 13 to 16 are each a graph depicting a result of measuring real-time responses for various activities of a human body by using an electronic system including the pressure sensor fabricated in Evaluation Example 2.

Figure 13:
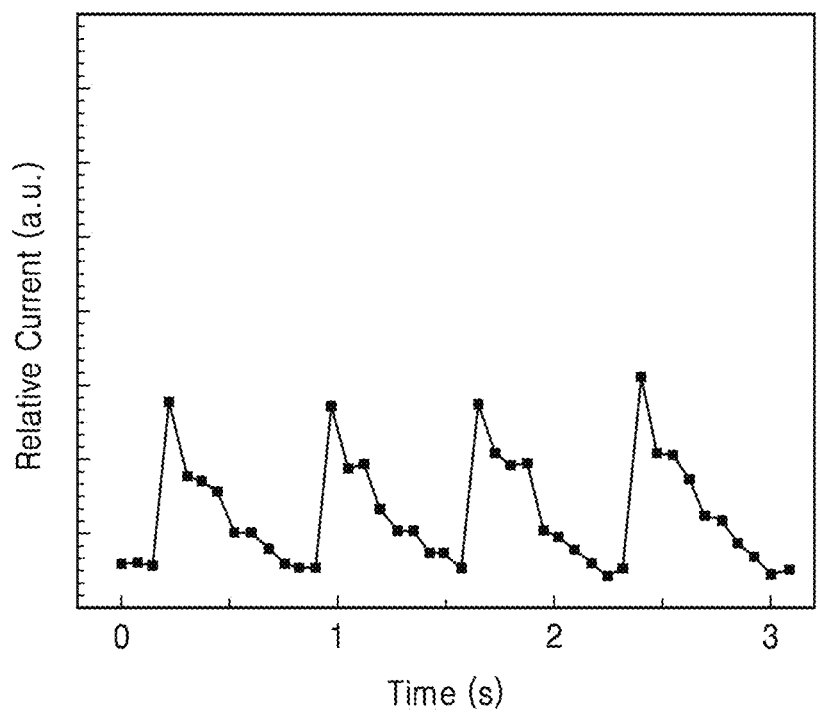
FIGS. 13, 14, 15 and 16 are each a graph depicting a result of measuring real-time responses for various activities of a human body by using an electronic system including a pressure sensor, according to an embodiment of the present inventive concept.
Figure 14:
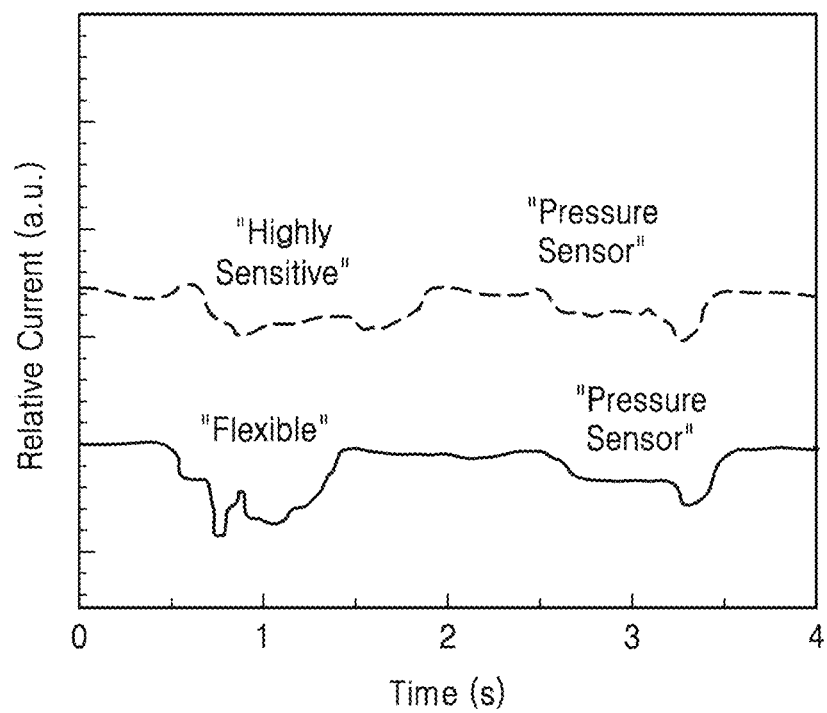
Figure 15:
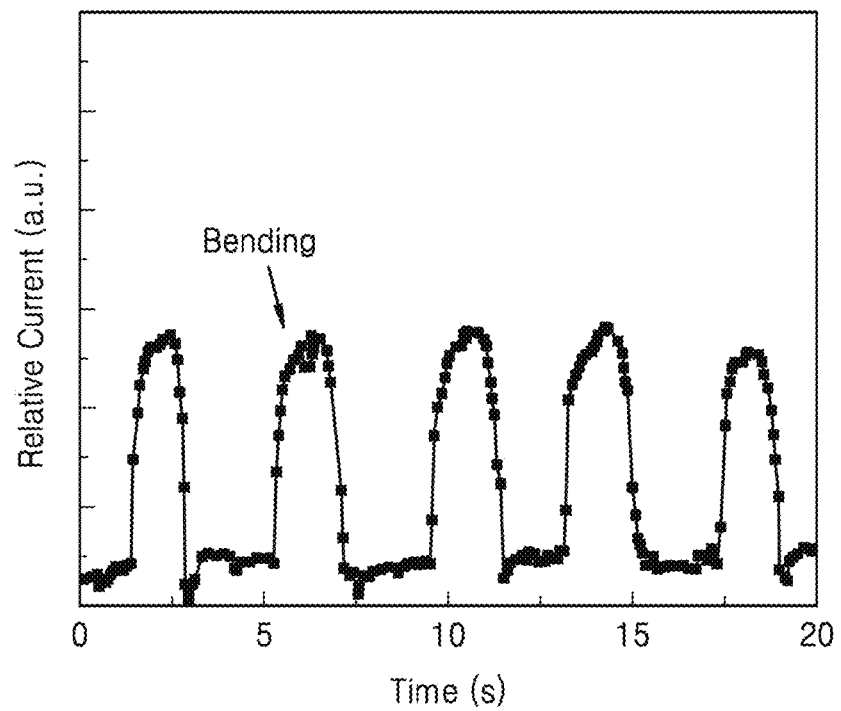
Figure 16:
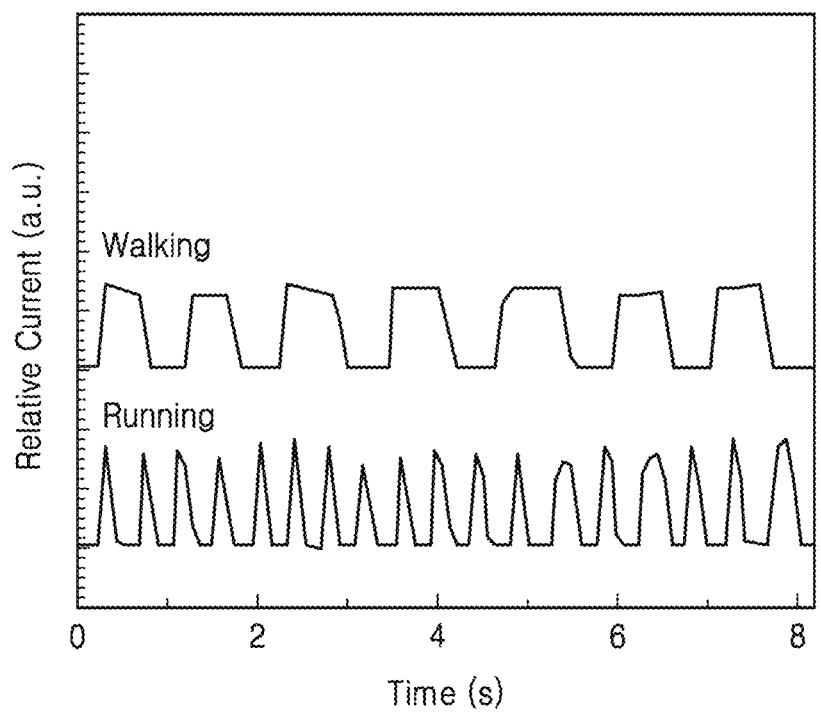

FIG. 13 shows a result of measuring responses according to arterial changes while the electronic system is attached to an arm of a human body. FIG. 14 shows a result of measuring responses (the dashed curve in FIG. 14) according to motions of the Adam's apple of a human body upon speaking "highly sensitive pressure sensor", and responses (the solid curve in FIG. 14) according to motions of the Adam's apple of the human body upon speaking "flexible pressure sensor", while the electronic system is attached to the neck of the human body. FIG. 15 shows a result of measuring responses according to repeated bending actions of a wrist of a human body while the electronic system is attached to the wrist. FIG. 16 shows a result of measuring responses according to walking and running actions of a human body wearing shoes while the electronic system is attached to a portion of the inside of the shoes, which faces a heel of the human body.

As described above, the pressure sensor according to an embodiment of the present inventive concept and the electronic system including the pressure sensor have excellent sensitivity to various motions or stimuli and excellent repeatability and reproducibility, and thus, may perform intended sensing functions without being damaged by physical deformation, such as a repeated stimulus or impact, bending, or distortion. In addition, because the piezoresistive pattern has a porous structure, the pressure sensor may exhibit high sensitivity to various magnitudes of pressure applied to a touch surface of the pressure sensor and may provide sufficient properties to be used as a tactile sensor or an artificial electronic skin. For example, the properties include relatively high flexibility, fast response speed, relatively high durability, and the like.

Furthermore, because the piezoresistive pattern in the pressure sensor according to an embodiment of the present inventive concept may be obtained by using a dispersion solution, the piezoresistive pattern may be easily applied to a large-area process due to an easy patterning process thereof and may be implemented with various sizes, various thicknesses, and various shapes by applying various processes thereto. Therefore, various sensors including a pressure sensor array and/or an electronic system, which includes the pressure sensor according to an embodiment of the present inventive concept, may be easily implemented by a relatively simple fabrication process.

While the present inventive concept has been described with reference to embodiments thereof, it will be understood by those of ordinary skill in the art that various changes in form and details may be made thereto without departing from the spirit and scope of the present inventive concept.

What is claimed is:

1. A pressure sensor comprising:
a first substrate;
a second substrate having an inner surface and a touch surface that is opposite to the inner surface, wherein the inner surface faces the first substrate with a resistance sensing space therebetween;
a first electrode and a second electrode, which are arranged spaced apart from each other in the resistance sensing space; and
a piezoresistive pattern arranged between the first electrode and the second electrode and disposed in the resistance sensing space, wherein the piezoresistive pattern comprises a porous elastic support and a plurality of conductive carbon structures dispersed in the porous elastic support, and
wherein the first electrode and the second electrode are arranged at a same level as each other on the first substrate, and face each other with the piezoresistive pattern therebetween in a direction that is parallel to a main surface of the first substrate, and
wherein each of the first electrode and the second electrode is closer to the first substrate than to the second substrate, and the piezoresistive pattern contacts the inner surface of the second substrate.

2. The pressure sensor of claim 1, wherein the piezoresistive pattern has a network structure comprising a plurality of pores, wherein the network structure is formed of the porous elastic support intertwined with the plurality conductive carbon structures.

3. The pressure sensor of claim 1, wherein each of the plurality of conductive carbon structures comprises a porous carbon-based material.

4. The pressure sensor of claim 1, wherein each of the first substrate and the second substrate comprises an insulating substrate.

5. The pressure sensor of claim 1, wherein each of the first electrode and the second electrode comprises a metal, a conductive metal nitride, an alloy, a doped semiconductor, a conductive polymer, a conductive compound, or a combination thereof.

6. The pressure sensor of claim 1, further comprising an insulating passivation layer arranged between the first substrate and both the first electrode and the second electrode, wherein an upper surface of the insulating passivation layer contacts a lower surface of each of the first electrode and the second electrode, and a lower surface of the insulating passivation layer contacts the main surface of the first substrate.

7. The pressure sensor of claim 1, wherein the plurality of conductive carbon structures are present in an amount of about 5 wt % to about 50 wt % in the piezoresistive pattern.

8. The pressure sensor of claim 1, wherein a minimum distance between the first electrode and the second electrode is between about 100 μm to about 500 μm, and
each of the plurality of conductive carbon structures in the piezoresistive pattern has a length ranging from about 5 μm to about 30 μm and a diameter ranging from about 1 nm to about 3 nm.

9. The pressure sensor of claim 1, wherein each of the first electrode and the second electrode faces the second substrate with the piezoresistive pattern between the second substrate and both the first electrode and the second electrode, and
a height of each of the first electrode and the second electrode is less than a minimum distance between the first substrate and the second substrate.

10. The pressure sensor of claim 1, wherein the pressure sensor has a transmittance of at least 70% of light in a visible light wavelength range.

11. An electronic system comprising the pressure sensor of claim 1.

12. A pressure sensor pixel array comprising:
a first substrate;
a second substrate having an inner surface and a touch surface that is opposite to the inner surface, wherein the inner surface faces the first substrate with a resistance sensing space therebetween;
a plurality of pixel areas arranged spaced apart from each other in a horizontal direction in the resistance sensing space; and
a plurality of pressure sensors respectively arranged in the plurality of pixel areas,
wherein each of the plurality of pressure sensors comprises:
a first electrode and a second electrode, which are arranged spaced apart from each other in each of the plurality of pixel areas; and
a piezoresistive pattern arranged between the first electrode and the second electrode in each of the plurality of pixel areas, and
wherein the piezoresistive pattern comprises a porous elastic support and a plurality of conductive carbon structures dispersed in the porous elastic support.

13. The pressure sensor pixel array of claim 12, wherein the plurality of pressure sensors are arranged in a matrix form in a first horizontal direction and a second horizontal direction crossing the first horizontal direction,
wherein first electrodes, which are respectively comprised in pressure sensors adjacent to each other in the first horizontal direction from among the plurality of pressure sensors, are connected to each other,
wherein second electrodes, which are respectively comprised in pressure sensors adjacent to each other in the second horizontal direction from among the plurality of pressure sensors, are connected to each other, and
piezoresistive patterns, which are respectively comprised in pressure sensors adjacent to each other in the first horizontal direction and the second horizontal direction from among the plurality of pressure sensors, are spaced apart from each other.

14. The pressure sensor pixel array of claim 12, wherein each of the plurality of conductive carbon structures in the piezoresistive pattern comprises a single-walled carbon nanotube having a length ranging from about 5 μm to about 30 μm and a diameter ranging from about 1 nm to about 3 nm, wherein the plurality of conductive carbon structures are present in an amount of about 5 wt % to about 50 wt % in the piezoresistive pattern, and the piezoresistive pattern has a network structure comprising a plurality of pores, wherein the network structure is formed of the porous elastic support intertwined with the plurality conductive carbon structures.

15. A pressure sensor pixel array comprising:

a first substrate;

a plurality of pixel areas arranged spaced apart from each other on the first substrate, wherein the plurality of pixel areas are arranged in a matrix form in a first horizontal direction and a second horizontal direction, which intersect each other;

a plurality of first electrode lines comprising a plurality of first local electrodes and extending lengthwise in the second horizontal direction on the first substrate, wherein the plurality of first local electrodes respectively cover the plurality of pixel areas;

a plurality of second electrode lines comprising a plurality of second local electrodes and arranged respectively apart from the plurality of first electrode lines in the plurality of pixel areas, wherein the plurality of second electrode lines extend lengthwise in the first horizontal direction on the first substrate, wherein the plurality of second local electrodes are arranged spaced apart from the plurality of first local electrodes and cover the plurality of pixel areas, respectively;

a plurality of piezoresistive patterns disposed on the plurality of first local electrodes and the plurality of second local electrodes in the plurality of pixel areas, respectively; and a second substrate arranged spaced apart from the plurality of first local electrodes and the plurality of second local electrodes with the plurality of piezoresistive patterns therebetween, wherein the second substrate faces the first substrate with the plurality of first electrode lines, the plurality of second electrode lines, and the plurality of piezoresistive patterns therebetween, wherein the plurality of piezoresistive patterns are arranged spaced apart from each other to respectively correspond to the plurality of pixel areas, and wherein each of the plurality of piezoresistive patterns comprises a porous elastic support and a plurality of conductive carbon structures dispersed in the porous elastic support, wherein each of the plurality of piezoresistive patterns have a network structure comprising a plurality of pores.

16. The pressure sensor pixel array of claim 15, wherein, in each of the plurality of pixel areas, one of the plurality of first local electrodes and one of the plurality of second local electrodes constitute interdigitated electrodes.

17. The pressure sensor pixel array of claim 15, wherein, in each of the plurality of piezoresistive patterns, each of the plurality of conductive carbon structures comprises a single-walled carbon nanotube that is surface-functionalized with a hydroxyl group, wherein each of the plurality of conductive carbon structures has a length ranging from about 5 μm to about 30 μm and a diameter ranging from about 1 nm to about 3 nm and, wherein in each of the plurality of piezoresistive patterns, the plurality of conductive carbon structures are present in an amount of about 5 wt % to about 50 wt %.

* * * * *